US007241954B2

(12) United States Patent
Kanai

(10) Patent No.: US 7,241,954 B2

(45) Date of Patent: Jul. 10, 2007

(54) METHOD FOR REDUCING ELECTROMAGNETIC DISTURBANCE WAVE AND HOUSING STRUCTURE

(75) Inventor: Ken Kanai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/770,446

(22) Filed: Feb. 4, 2004

(65) Prior Publication Data

US 2004/0200632 A1 Oct. 14, 2004

(30) Foreign Application Priority Data

Feb. 7, 2003 (JP) ............................ 2003-031395
Jul. 17, 2003 (JP) ............................ 2003-198549

(51) Int. Cl.
*H05K 9/00* (2006.01)

(52) U.S. Cl. ...................................... 174/383; 174/377

(58) Field of Classification Search .............. 174/35 R, 174/35 MS, 383, 377; 361/816, 818
See application file for complete search history.

(56) References Cited

U.S. PATENT DOCUMENTS 5,539,148 A * 7/1996 Konishi et al. ........... 174/35 R
5,841,067 A * 11/1998 Nakamura et al. ..... 174/35 MS
5,895,884 A * 4/1999 Davidson .................. 174/35 R
6,546,107 B1 * 4/2003 Bohnke ...................... 381/189

FOREIGN PATENT DOCUMENTS

JP 5-199340 8/1993

OTHER PUBLICATIONS

H. W. Ott, A Wiley-Interscience Publication, Second Edition, pp. 187-191, "Noise Reduction Techniques in Electronic Systems", 1988.

* cited by examiner

*Primary Examiner*—Hung V. Ngo
(74) *Attorney, Agent, or Firm*—Oblon, Spivak, McClelland, Maier & Neustadt, P.C.

(57) ABSTRACT

A method for reducing an electromagnetic disturbance wave generated at an electronic apparatus, by covering the electronic apparatus with a housing which is formed by a material having a shield effect against an electromagnetic wave, includes providing a space forming part for radiation of heat or wiring at the housing, so that a longitudinal direction of the space forming part is along a surface electric current distribution in a case where the space forming part is not provided at the housing.

7 Claims, 13 Drawing Sheets

(a)

(b)

METHOD FOR REDUCING ELECTROMAGNETIC DISTURBANCE WAVE AND HOUSING STRUCTURE

BACKGROUND OF THE INVENTION

1. Field of the Invention

The present invention relates to methods for reducing electromagnetic disturbance waves and housing structures, the electromagnetic disturbance being generated at the housings having electronic apparatuses.

2. Description of the Related Art

Recently, although various kinds of apparatuses where an electric apparatus is installed have become widespread, electromagnetic waves generated from the electric apparatuses is a problem under a recent trend where the electric apparatus has a high quality function of and a high clock speed. Particularly, in an image reader part of an image forming machine such as a copy machine, the clock frequency becomes high for accomplishment of high quality output. Because of this, influence of leakage of electromagnetic wave noises on various parts become a more serious problem.

There is a related art copy machine having a housing structure similar to the present invention, as described in the Japanese Laid-Open Patent Application, H05-199340. This related art copy machine has a structure, wherein an electronic apparatus section, having electronic parts such as an image read part, an image write part, and a primary signal processing part for corrective processing of an image signal, is received in an inside part of a conductive housing which is grounded, so that an electromagnetic wave shielding is attempted and an electromagnetic wave noise leaked to an outside part of the housing is reduced.

However, according to the related art copy machine, it is required to form a space part such as a hole, opening, or gap at the housing in order to radiate heat generated from an electronic apparatus which is received at the conductive housing. Because of this, there is a problem in that it may be difficult to cope with both an effect of radiant heat and a shield against electromagnetic wave noise due to the leakage of the electromagnetic wave noise from the space part.

Particularly, in the related art copy machine, a reading apparatus of an operations clock having a high frequency and a signal processing part are provided at the housing to form a scanner of the image read part. Hence, according the related art copy machine, even if the electronic apparatus is received at the conductive housing, it may be possible that the electromagnetic wave noise leaks out from a small space part for radiating heat.

SUMMARY OF THE INVENTION

Accordingly, it is a general object of the present invention to provide a novel and useful method for reducing electromagnetic disturbance waves and a housing structure, in which one or more of the problems described above are eliminated.

Another and more specific object of the present invention is to provide a method for reducing electromagnetic disturbance waves and a housing structure, so that it is possible to cope with both an effect of radiant heat and a shield against the electromagnetic wave noise without making the structure of an electronic apparatus complex. This includes consideration of a positioning relationship between an electromagnetic field of a resonance frequency determined by a measurement of a housing where the electronic apparatus is installed, and a distribution of an electric current sent on a surface of the housing, and a space part of the housing.

Another object of the present invention is to provide a method for reducing electromagnetic disturbance waves and a housing structure, so that it is possible to cope with both an effect of radiant heat and a shield against the electromagnetic wave noise by using a housing which can be easily manufactured.

The above objects of the present invention are achieved by a method for reducing an electromagnetic disturbance wave generated at an electronic apparatus, by covering the electronic apparatus with a housing which is formed by a material having a shield effect against an electromagnetic wave, including:

providing a space forming part for radiation of heat or wiring at the housing, so that a longitudinal direction of the space forming part is along a surface electric current distribution in a case where the space forming part is not provided at the housing.

The above objects of the present invention are achieved by a housing structure for reducing an electromagnetic disturbance wave generated at an electronic apparatus, by covering the electronic apparatus with a housing which is formed by a material having a shield effect against an electromagnetic wave; including:

a space forming part for radiation of heat or wiring at the housing, wherein a longitudinal direction of the space forming part is along a surface electric current distribution in a case where the space forming part is not provided at the housing.

According to the above mentioned inventions, it is possible to cope with both an effect of radiant heat and high shield-ability against the electromagnetic wave noise under a simple structure.

In the method or housing structure, the housing may be formed by a material including a conductor or a semiconductor which has a volume resistivity of less than or equal to $10^{4}$„ cm.

According to the above mentioned invention, even if the housing is not formed by a metal, it is possible to accomplish the shield effect.

In the method or housing structure, the space forming part may be formed so as to have a slit shape or a rectangular shape, and the space forming part in the longitudinal direction may be formed radially from a gush part or a concentration part of the surface electric current of the housing.

According to the above mentioned invention, it is possible to cope with both an effect of radiant heat and high shield-ability against the electromagnetic wave noise under a more simple structure.

In the method or housing structure, the housing may have a rectangular parallelepiped shape, and the space forming part in the longitudinal direction may be formed radially from a gush part or a concentration part of the surface electric current calculated by a designated numerical formula.

According to the above mentioned invention, it is possible to cope with both an effect of radiant heat and high shield-ability against the electromagnetic wave noise under a simple structure, and to position the space properly under a calculation of the surface electric current distribution with a numerical analysis for example, even if the housing does not have the a rectangular parallelepiped shape.

In the method or housing structure, the space forming part may be formed so as to have a slit shape or a rectangular shape, and the space forming part in the longitudinal direction may be formed radially from a center part of a magnetic field situated at an inside part of the housing, calculated by a designated numerical formula.

According to the above mentioned invention, it is possible to cope with both an effect of radiant heat and high shield-ability against the electromagnetic wave noise under a simple structure, and to position the space part properly under a calculation of a center position of the magnetic field with a numerical analysis, for example, even if the housing does not have a rectangular parallelepiped shape.

In the method or housing structure, a measurement of the housing may be set so that a resonance frequency of an electromagnetic wave in the housing is generated only by a frequency higher than an upper limit frequency of EMI (Electro Magnetic Interference).

According to the above mentioned invention, it is possible to make the strength of the electromagnetic field that is leaked constant.

In the method or housing structure, a hole forming part other than the space forming part may be provided, and a size of the hole forming part may be set so as to be less than or equal to one fourth, more preferably less than or equal to one tenth, of the wavelength of an electromagnetic wave to be reduced.

According to the above mentioned invention, it is possible to cope with both an effect of radiant heat and high shield-ability against the electromagnetic wave noise under a simple structure, and to estimate, in advance, a shield effect in a case where the hole is formed at the housing.

In the method or housing structure, the space forming part may be provided at an upper or lower part, or the upper and lower parts of the housing.

According to the above mentioned invention, it is possible to cope with both an effect of radiant heat and high shield-ability against the electromagnetic wave noise under a simple structure, and make heat radiative ability higher.

In the method or housing structure, the housing may have a connection part, and the connection part in the longitudinal direction may be provided so as to be along the longitudinal direction of the space forming part.

According to the above mentioned invention, it is possible to achieve a stable effect of reduction of electromagnetic wave noise even if the housing has the connection part, and to cope with both an effect of radiant heat and high shield-ability against the electromagnetic wave noise under a simple structure.

In the method or housing structure, the housing may have a connection part, and the longitudinal direction of the connection part may be along a surface electric current distribution in a case where the connection part is not provided at the housing.

According to the above mentioned invention, it is possible to achieve a stable effect of reduction of electromagnetic wave noise even if the housing has the connection part, and to cope with both an effect of radiant heat and high shield-ability against the electromagnetic wave noise under a simple structure.

In the method or housing structure, the connection part in the longitudinal direction may be formed radially from a gush part or a concentration part of the surface electric current of the housing.

According to the above mentioned invention, it is possible to cope with both an effect of radiant heat and high shield-ability against the electromagnetic wave noise under a simple structure. Furthermore, since the connection part in the longitudinal direction is arranged in a most proper direction, even if the housing does not have a rectangular parallelepiped shape, it is possible to position the connection part properly under a calculation of the surface electric current distribution with a numerical analysis, for example, so that higher shield-ability can be achieved.

In the method or housing structure, the housing may have a rectangular parallelepiped shape, and the connection part in the longitudinal direction may be formed radially from a gush part or a concentration part of the surface electric current calculated by a designated numerical formula.

According to the above mentioned invention, it is possible to cope with both an effect of radiant heat and high shield-ability against the electromagnetic wave noise under a simple structure. Furthermore, since the housing has a rectangular parallelepiped shape, it is possible to arrange the connection part properly under a simple calculation of the surface electric current distribution with a numerical analysis, for example, so that higher shield-ability can be achieved.

In the method or housing structure, the housing may have a connection part having a good electrical resistance and a connection part having a bad electrical resistance, and the connection part having the bad electrical resistance in a longitudinal direction may be along a surface electric current distribution in a case where the connection part having the bad electrical resistance is not provided at the housing.

According to the above mentioned invention, it is possible to stably effect reduction of electromagnetic wave noise even if the housing has the connection part having bad conductivity, and to cope with both an effect of radiant heat and high shield-ability against the electromagnetic wave noise under a simple structure. Furthermore, it is possible to provide a housing which can be manufactured easily by arranging the connection part having bad conductivity so as not to disturb the surface electricity current.

In the method or housing structure, the connection part having the bad electrical resistance in a longitudinal direction may be formed radially from a gush part or a concentration part of the surface electric current of the housing.

According to the above mentioned invention, it is possible to cope with both an effect of radiant heat and high shield-ability against the electromagnetic wave noise under a simple structure. Furthermore, since the connection part having bad electric resistance in the longitudinal direction is arranged in a most proper direction, even if the housing does not have a rectangular parallelepiped shape, it is possible to position the connection part having bad electric resistance properly under a calculation of the surface electric current distribution with a numerical analysis, for example, so that a higher shield-ability can be achieved.

In the method or housing structure, the housing may have a rectangular parallelepiped shape, and the connection part having the bad electrical resistance in the longitudinal direction may be formed radially from a gush part or a concentration part of the surface electric current calculated by a designated numerical formula.

According to the above mentioned invention, it is possible to cope with both an effect of radiant heat and high shield-ability against the electromagnetic wave noise under a simple structure. Furthermore, since the housing has a rectangular parallelepiped shape, it is possible to arrange the connection part having a bad electric resistance properly under a simple calculation of the surface electric current distribution with a numerical analysis for example, so that higher shield-ability can be achieved.

In the method or housing structure, the space forming part may be arranged in a direction in which a flow of a cooling medium for elimination of heat or air change is not disturbed.

According to the above mentioned invention, it is possible to cope with both an effect of radiant heat and high shield-ability against the electromagnetic wave noise under a simple structure, and to obtain a higher radiant heat transfer effect.

In the method or housing structure, a pipe for communicating between an inside and an outside of the housing may be provided at the housing, and a width of an opening part of the pipe may be set so as to be less than or equal to a half of a wavelength of a frequency to be reduced.

According to the above mentioned invention, the electromagnetic wave having a frequency which is lower than a frequency to be reduced to cannot be leaked from a pipe through which a signal line which connects the inside and the outside of the housing passes, and therefore it is possible to keep high shield-ability against the electromagnetic wave noise.

In the method or housing structure, a harness or an electrical wire or cord for communicating information or electric power between the electric apparatus situated at the inside of the housing and an outside of the housing, may be provided at the housing, so as to not disturb a surface electrical current distribution in a case where the harness or the electrical wire or cord is not provided at the housing.

According to the above mentioned invention, in a case where the harness or the electrical wire or cord is provided at the housing, good shield-ability against the electromagnetic wave noise can be obtained. Accordingly, it is possible to cope with both an effect of radiant heat and high shield-ability against the electromagnetic wave noise under a simple structure.

In the method or housing structure, an electric optical conversion element for converting an electric signal of the electric apparatus provided at an inside of the housing to an optical signal, an optical fiber for sending the optical signal converted by the electric optical conversion element from the space forming part to an outside of the housing, and an optical electric conversion element for converting the optical signal which is sent to the outside of the housing by the optical fiber to an electric signal, may be provided, so that the electric signal of the electric apparatus in the housing is converted to the optical signal by the electric optical conversion element, the converted optical signal is sent from the space forming part to the optical electrical conversion element at the outside part of the housing and is converted to the electric signal, and therefore information is communicated between the electric apparatus situated at the inside of the housing and the outside of the housing.

According to the above mentioned invention, it is possible to optically communicate a signal between the electronic apparatus situated at the inside of the housing and the outside of the housing. Therefore, it is possible to avoid leakage of an electromagnetic wave from an opening part for signal transmission at all frequencies. Hence, it is possible to cope with both an effect of radiant heat and high shield-ability against the electromagnetic wave noise under a simple structure.

In the method or housing structure, an electric infrared conversion element for converting an electric signal of the electric apparatus provided at an inside of the housing to an infrared signal, and an infrared electric conversion element for converting the infrared signal which is converted by the electric infrared conversion element to an electric signal, may be provided, so that the electric signal of the electric apparatus in the housing is converted to the infrared signal by the electric infrared conversion element, the converted infrared signal is sent from the space forming part to the outside part of the housing, and the infrared signal sent to the outside part of the housing is converted to the electric signal by the infrared electric conversion element, and therefore information is communicated between the electric apparatus situated at the inside of the housing and the outside of the housing.

According to the above mentioned invention, it is possible to communicate a signal between the electronic apparatus situated at the inside of the housing and the outside of the housing by infrared. Therefore, it is possible to avoid leakage of an electromagnetic wave from an opening part for signal transmission at all frequencies. Hence, it is possible to cope with both an effect of radiant heat and high shield-ability against the electromagnetic wave noise under a simple structure. Furthermore, it is possible to build a system at a low cost.

In the method or housing structure, a heat pipe for radiating heat generated at the electric apparatus provided at the inside of the housing to an outside part of the housing, may be provided along a wall surface of the housing.

According to the above mentioned invention, it is possible to raise the heat radiative ability and to avoid reduction of the shield-ability against the electromagnetic wave due to disturbance of an original surface electricity current and magnetic field distribution. Therefore, it is possible to achieve an effect of radiant heat and high shield-ability against the electromagnetic wave noise under a simple structure.

In the method or housing structure, the housing may be formed by a metal material.

According to the above mentioned invention, it is possible to further achieve an effect of radiant heat and high shield-ability against the electromagnetic wave noise under a simple structure.

In the method or housing structure, the housing may have an internal surface or external surface where a thin film formed by a conductor is applied.

According to the above mentioned invention, it is possible to achieve the same result as the metal housing by a plastic which can be easily manufactured.

In the method or housing structure, the housing may be formed by a material having a volume resistivity of greater than or equal to $10^{8}$„ cm, and the housing may have an internal surface or external surface where a thin film formed by a material having a volume resistivity of less than or equal to $10^{-4}$„ cm is applied.

According to the above mentioned invention, it is possible to form a housing having a shield effect by using various kinds of materials.

In the method or housing structure, the housing may be formed by a plastic material, and the housing may have an internal surface or external surface where a metal thin film is applied.

According to the above mentioned invention, it is possible to form the housing having the same shield effect as the metal housing by a plastic which can be easily manufactured. Hence, it is possible to cope with both an effect of radiant heat and high shield-ability against the electromagnetic wave noise under a simple structure.

In the method or housing structure, a thickness of the thin film may be greater than a skin depth of a skin effect at a lower limit frequency under an EMI (ElectroMagnetic Interference) regulation.

According to the above mentioned invention, it is possible to cope with both an effect of radiant heat and high shield-ability against the electromagnetic wave noise under a simple structure. In addition, since the thickness of the thin film layer can be estimated in advance, it is possible to obtain an effective shield effect.

In the method or housing structure, the thin film layer may be glued to the housing via an adhesion layer, and a sticking part of the thin film, for gluing the thin film layer, may be provided in a direction along a surface electric current distribution of the housing in a case where the sticking part is not provided.

According to the above mentioned invention, it is possible to use a metal tape which is cheap, for example, as the thin film layer. Hence, it is possible to cope with both an effect of radiant heat and high shield-ability against the electromagnetic wave noise under a simple structure.

In the method or housing structure, the sticking part of the thin film layer in the longitudinal direction may be formed radially from a gush part or a concentration part of the surface electric current of the housing.

According to the above mentioned invention, it is possible to properly arrange a position where the metal tape is put with a numerical analysis, for example, even if a cheap metal tape is used as the thin film layer. Hence, it is possible to cope with both an effect of radiant heat and high shield-ability against the electromagnetic wave noise under a simple structure.

In the method or housing structure, the housing may have a rectangular parallelepiped shape, and the sticking part for the thin film layer in the longitudinal direction may be formed radially from a gush part or a concentration part of the surface electric current calculated by a designated numerical formula.

According to the above mentioned invention, it is possible to properly arrange a position where the metal tape is put, using a simple calculation corresponding to the rectangular parallelepiped shape, even if a cheap metal tape is used as the thin film layer. Hence, it is possible to cope with both an effect of radiant heat and high shield-ability against the electromagnetic wave noise under a simple structure.

In the method or housing structure, a metal pipe for communicating between an inside and an outside of the housing may be provided at the housing so as to come in contact with the thin film layer.

According to the above mentioned invention, it is possible to prevent the electromagnetic wave from leaking from the metal pipe provided at the housing formed by the metal thin layer, and therefore it is possible to keep high shield-ability against the electromagnetic wave noise.

Other objects, features, and advantages of the present invention will become more apparent from the following detailed description when read in conjunction with the accompanying drawings.

BRIEF DESCRIPTION OF THE DRAWINGS

FIG. 8-(*a*) shows a frequency characteristic of radiation electrical field strength in a case of a frequency from 0 Hz to 3 GHz, and FIG. 8-(*b*) shows a frequency characteristic of radiation electrical field strength in a case of a frequency from 0 Hz to 1.4 GHz;

FIG. 9-(*a*) shows a frequency characteristic of radiation electrical field strength in a case of a frequency from 0 Hz to 3 GHz, and FIG. 9-(*b*) shows a frequency characteristic of radiation electrical field strength in a case of a frequency from 0 Hz to 1.4 GHz;

FIG. 14-(*a*) is a view showing an embodiment of the present invention., and FIG. 14-(*b*) is a view showing a comparison example;

FIG. 21-(*a*) is a view showing an embodiment of the present invention, and FIG. 21-(*b*) is a view showing a comparison example;

FIG. 23-(*a*) shows a frequency characteristic of radiation electrical field strength in a case of a frequency from 0 Hz to 3 GHz, and FIG. 23-(*b*) shows a frequency characteristic of radiation electrical field strength in a case of a frequency from 0 Hz to 1.4 GHz; FIG. 24-(*a*) shows a frequency characteristic of radiation electrical field strength in a case of a frequency from 0 Hz to 3 GHz, and FIG. 24-(*b*) shows a frequency characteristic of radiation electrical field strength in a case of a frequency from 0 Hz to 1.4 GHz.

DETAILED DESCRIPTION OF THE PREFERRED EMBODIMENTS

A description of an image reader apparatus and a cylinder shaped lamp for the same, is given below, with reference to the FIGS. 1 through 24 of embodiments of the present invention.

First Embodiment

Figure 1:
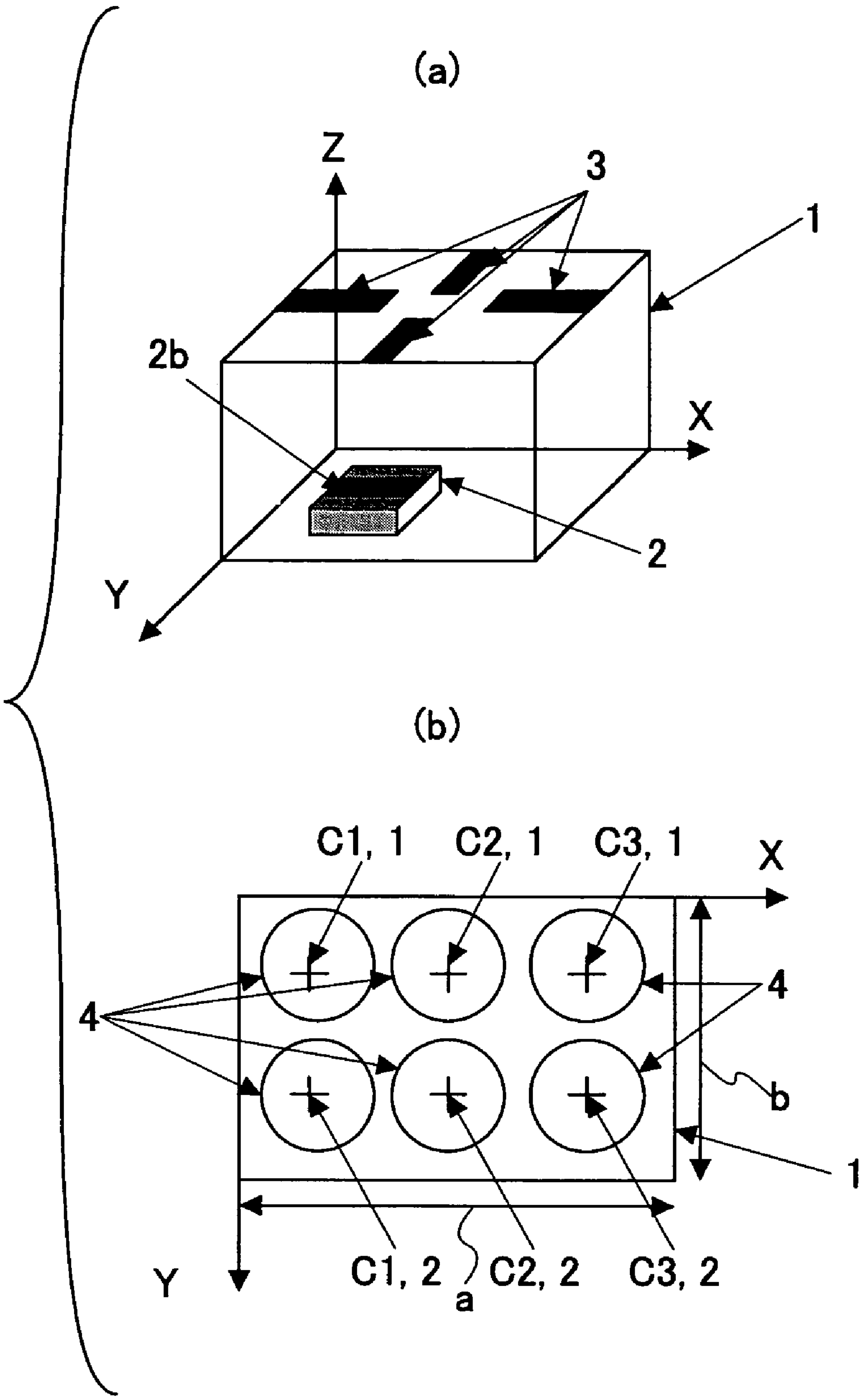
FIG. 1 is a perspective view for showing a structural example of a housing of the present invention; more specifically FIG. 1-(*a*) is a view for showing a three dimensional structure of the housing, and FIG. 1-(*b*) is a view of a distribution of a magnetic field generated at the housing, seen from a Z axis.

Referring to FIG. 1-(*a*), an electronic apparatus such as a printed board 2 wherein an electronic circuit (not shown) and a board line 2*b* are provided, is installed at an inside of a structure body (housing) 1 having a box configuration and formed by a material having a shield effect against an electromagnetic wave. At an upper surface of the housing 1, a plurality of the spaces (space forming parts) 3 for radiant heat transfer which have slit shapes are formed.

Thus, it is possible to reduce an electromagnetic disturbance wave generated by the printed board 2 by covering the printed board 2 provided inside of the housing 1 with the housing 1 formed by the material having the shield effect against the electromagnetic wave.

A resonance frequency f at the housing 1 is calculated by the following formula 1, wherein a length in an X direction of the housing 1 is set as “a”; a length in a Y direction of the housing 1 is set as “b”; a length in a Z direction of the housing 1 is set as “c”; and a velocity of the electromagnetic wave is set as “v”.

$$f = v \cdot \sqrt{\left(\frac{m}{2a}\right)^2 + \left(\frac{n}{2b}\right)^2 + \left(\frac{q}{2c}\right)^2} \qquad \text{(Formula 1)}$$

$$m = 1, 2, 3 \ldots, n = 1, 2, 3 \ldots, q = 0, 1, 2, \ldots$$

In the above formula 1, “m” represents a number of a magnetic patter in an X direction, “n” represents a number of a magnetic patter in a Y direction, and “q” represents a number of a magnetic patter in a Z direction.

Next, referring to FIG. 1-(*b*), a distribution of a magnetic field at some magnetic field pattern is discussed.

Here, FIG. 1-(*b*) is a view of a distribution of a magnetic field generated at the housing 1, seen from a Z axis in a case where 3 is input into the “m”; 2 is input into the “n”; and “0” is input into the “q” in the formula 1. In FIG. 1-(*b*), a reference letter “4” represents a magnetic field distribution which revolves in the housing 1, and reference letters “C1, 1” through “C3, 2” represent center positions of the magnetic field distribution which revolves in the housing 1.

Furthermore, in FIG. 1-(*b*), a position of “Cm1, n1 (m1=1 through m wherein “mm” is an optional integer, n1=1 through n wherein “n” is an optional integer) is calculated by the following formula 2.

$$Cm1, n1 = \left(\frac{a}{2m} + \frac{a}{m}(m1 - 1), -\left(\frac{b}{2n} + \frac{b}{n}(n1 - 1)\right)\right) \qquad \text{(Formula 2)}$$

Here, in the housing 1, in a case of a=200 mm, b=200 mm, and c=50 mm, a lowest resonance frequency has a value of 1.061 GHz wherein “m” equals 1, “n” equals 1, and “q” equals 0.

According to a boundary condition of the housing 1, the magnetic field distribution in the housing 1 is in a tangent direction of a metal surface. One magnetic field distribution which revolves is controlling in the housing even in a case where the frequency has a value less than 1 GHz and is similar with a case of “m” equals 1, “n” equals 1, and “q” equals 0.

Figure 2:
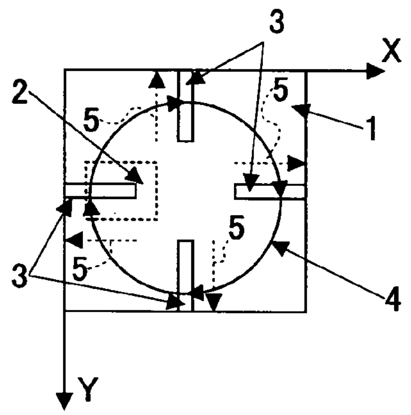
FIG. 2 is a view of distributions of the magnetic field and an induced electric current generated at the housing, seen from a Z axis.

FIG. 2 is a view of the view shown in FIG. 1-(*b*) and seen from a Z axis, in a state where the frequency has a value less than or equal to 1 GHz. In FIG. 2, the electronic apparatus (printed board) 2 is installed in the housing 1. A plurality of the spaces 3 having the slit shapes are formed at the housing 1. The magnetic field distribution 4 in the housing 1 is one magnetic field distribution which revolves.

In the formula 2, if 1 is input into “m”, 1 is input into “n”, 0 is input into “q”, 1 is input into “m1”, and 1 is input into “n1”, a formulation of “C1, 1=(a/2, −b/2) is obtained. The spaces 3 having slit shapes are provided radially in a state where a center position of an upper lid of the housing 1 is at the center. An induced current 5 (shown as a dotted line in FIG. 2) which is sent on the lid situated at the upper part of the housing 1 is sent so as to counter the magnetic field distribution at an inside part of the housing.

In the present invention, the space 3 is provided so that longitudinal directions of the spaces 3 having slit shapes are along a surface electric current distribution of the induced current 5 in a case where the space 3 is not formed in the housing 1. More specifically, the space 3 having the slit shapes in the longitudinal direction are formed radially from a gush part or a concentration part of the surface electric current of the housing, namely a center position of the magnetic field in the housing calculated by the above mentioned formula.

In a case where the frequency is between 0 and 1 GHz, the magnetic field in the housing which revolves is controlling. An induced current 5 (shown as a dotted line in FIG. 2) which is sent on the lid situated at the upper part of the housing 1 is sent so as to counter the magnetic field distribution at an inside part of the housing. Hence, directions of the magnetic field in the housing are a direction from a center of the lid of the housing 1 to an end part and a direction from the end part to the center part.

The space 3 having the slit shape which is provided at the housing 1 is provided so as to be perpendicular to a magnetic field distribution vector, namely so as to be along a direction of the induced current 5, from a center part of a revolution of the magnetic field distribution vector. Hence, it is possible to obtain a shield effect of the electromagnetic wave noise in a state where an induced current generated at the lid of the housing 1 is not disturbed and the spaces 3 having the slit shapes are provided at the housing 1, and therefore it is possible to obtain the radiant heat effect (transfer of radiant heat).

Figure 3:
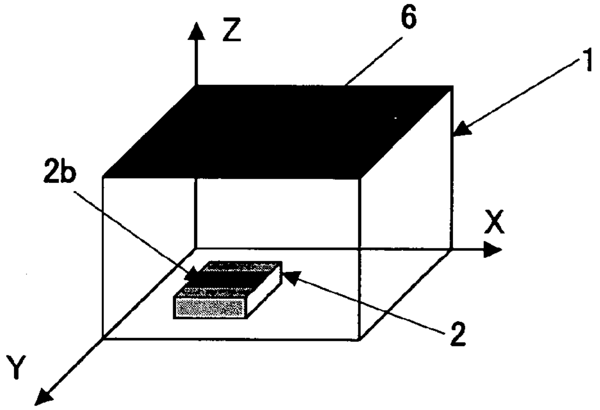
FIG. 3 is a perspective view showing a configuration example wherein a lid is not formed at an upper part of the housing.
Figure 4:
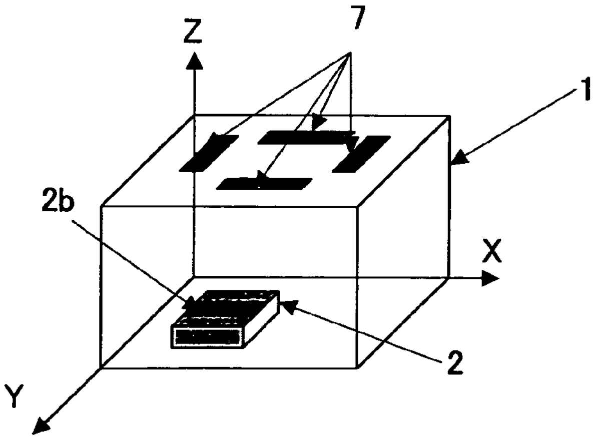
FIG. 4 is a perspective view showing a configuration example wherein an induced electric current, generated so as to be perpendicular to a revolving magnetic field distribution, is disturbed.

Next, an effect obtained by the housing 1 having the above-discussed structure is tested by a numerical simulation. Radiation electrical field strengths of a configuration (CASE 1) radial from a center part as the spaces 3 having the slit shape in FIG. 1, a configuration (CASE 2) having no lid at all at the upper part of the housing as shown in FIG. 3, and a configuration (CASE 3) disturbing the induced current generated so as to be perpendicular to the revolving magnetic field distribution as the spaces 7 having the slit shape in FIG. 4, are calculated. Here, the housing 1 is formed by a metal material, and therefore a volume resistivity of a general metal is used.

Figure 5:
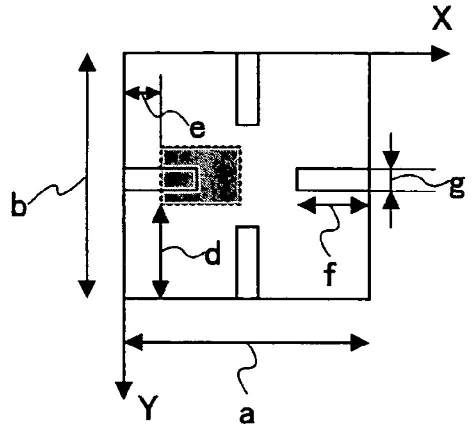
FIG. 5 is a plan view for explaining a measurement configuration of the housing shown in FIG. 1.
Figure 6:
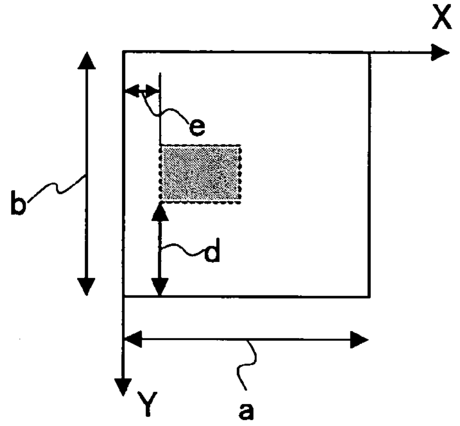
FIG. 6 is a plan view for explaining a measurement configuration of a housing shown in FIG. 3.
Figure 7:
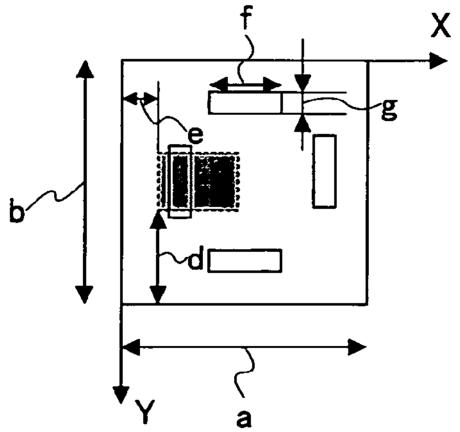
FIG. 7 is a plan view for explaining a measurement configuration of a housing shown in FIG. 4.

Measurement configurations of FIG. 1, FIG. 3 and FIG. 4 are shown in FIG. 5, FIG. 6, and FIG. 7. Here, "a" is 200 mm, "b" is 200 mm, "d" is 85 mm, "e" is 35 mm, "f" is 70 mm, and "g" is 5 mm. Here, an evaluation is implemented by a simulation of a numerical analysis method which is called the Finite Difference Time-Domain method (FDTD method). In this analysis, an analysis space is divided into lattice parts and the Maxwell equation is put in differential form and calculated with a time domain. More specifically, a Gaussian pulse is input to an input end of the printed board 2 which is an input point and an output wave shape taken at an operation point in the right upper part of the housing is Fourier transformed, so that information in the frequency domain can be obtained.

First, radiation electrical field strengths of CASE 1 shown in FIG. 1 and CASE 2 (comparison example) shown in FIG. 3 are calculated from an electric field right in the right upper part of the lid of the housing 1. The radiation electrical field strengths of CASE 1 shown in FIG. 1 and CASE 2 are shown in FIG. 8.

Figure 8:
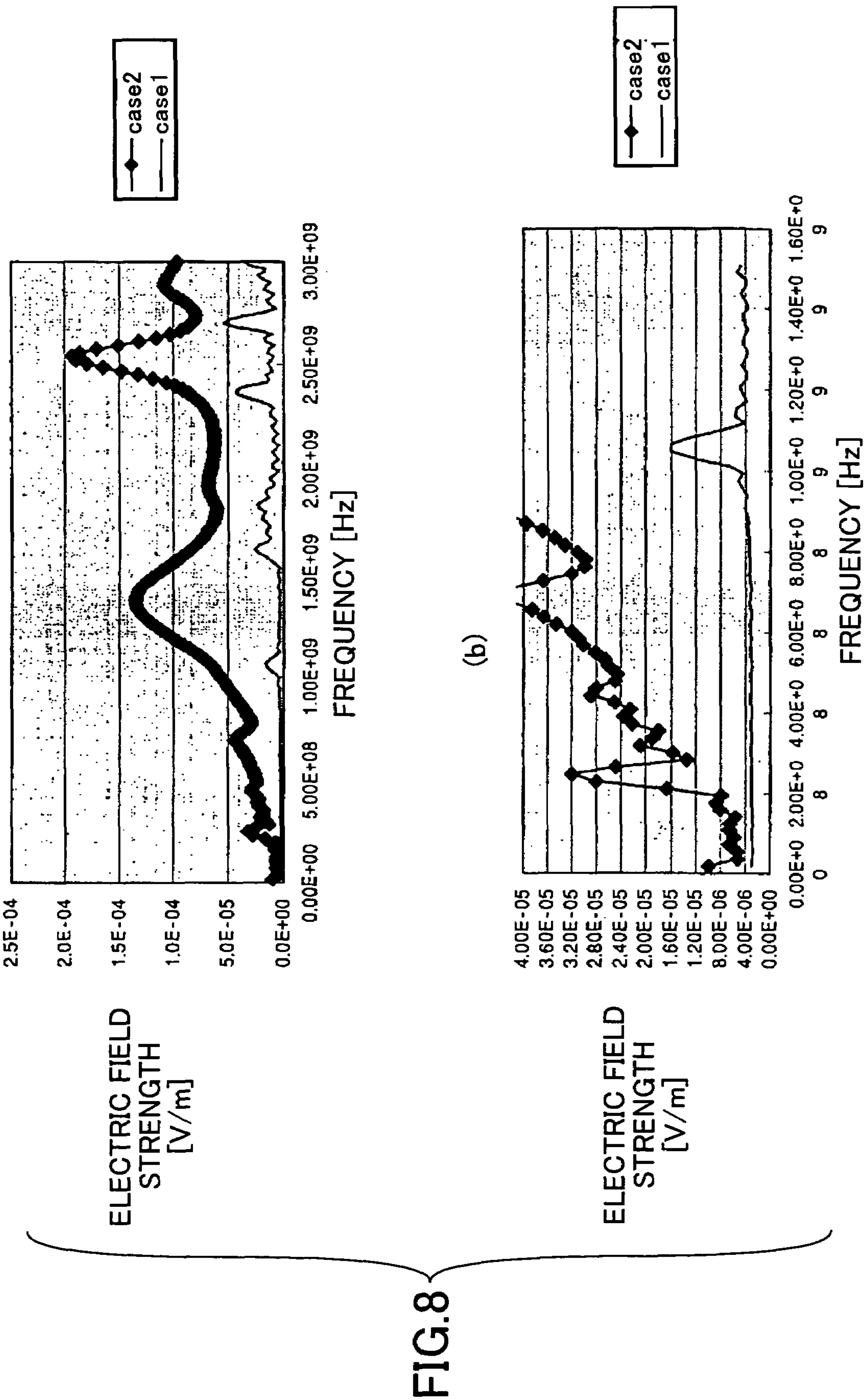
FIG. 8 contains graphs showing a frequency characteristic of radiation electrical field strength in a case where a metal housing is used as the housings shown in FIG. 1 and FIG. 3, more particularly.

FIG. 8-(*a*) shows radiation electrical field strength in a case of a frequency from 0 Hz to 3.00E+09 Hz (3 GHz), and FIG. 8-(*b*) shows a radiation electrical field strength in a case of a frequency from 0 Hz to 1.50E+09 Hz (1.5 GHz). In this embodiment, $3.00\times10^9$ is represented as 3.00E+09.

As understood from FIG. 8-(*b*), in a case of the CASE 2 wherein the lid is opened, the electric field strength wherein the frequency is between 2.00E+08 Hz (200 MHz) and 1.00E+09 Hz (1 GHz), exceeds 8.00E−06 V/m. On the other hand, in a case of the CASE 1, the electric field strength wherein the frequency is between 2.00E+08 Hz (200 MHz) and 1.00E+09 Hz (1 GHz), is less than or equal to 3.00E−06 V/m. Thus, the CASE 3 wherein the spaces have a slit shape radially from the center part of the housing 1 of the CASE 1 has a shield effect twice as or more than twice of the CASE 2 wherein the lid is not provided at the housing, in the case where the frequency ranges between 2.00E+08 Hz (200 MHz) and 1.00E+09 Hz (1 GHz).

The above mentioned value is a rough value for proving the shield effect by comparing the CASE 1 and CASE 2.

Next, radiation electrical field strengths of CASE 1 shown in FIG. 1 and CASE 3 (comparison example) shown in FIG. 4 are calculated from an electric field in the right upper part of the lid of the housing. The radiation electrical field strengths of CASE 1 shown in FIG. 1 and CASE 3 are shown in FIG. 9.

Figure 9:
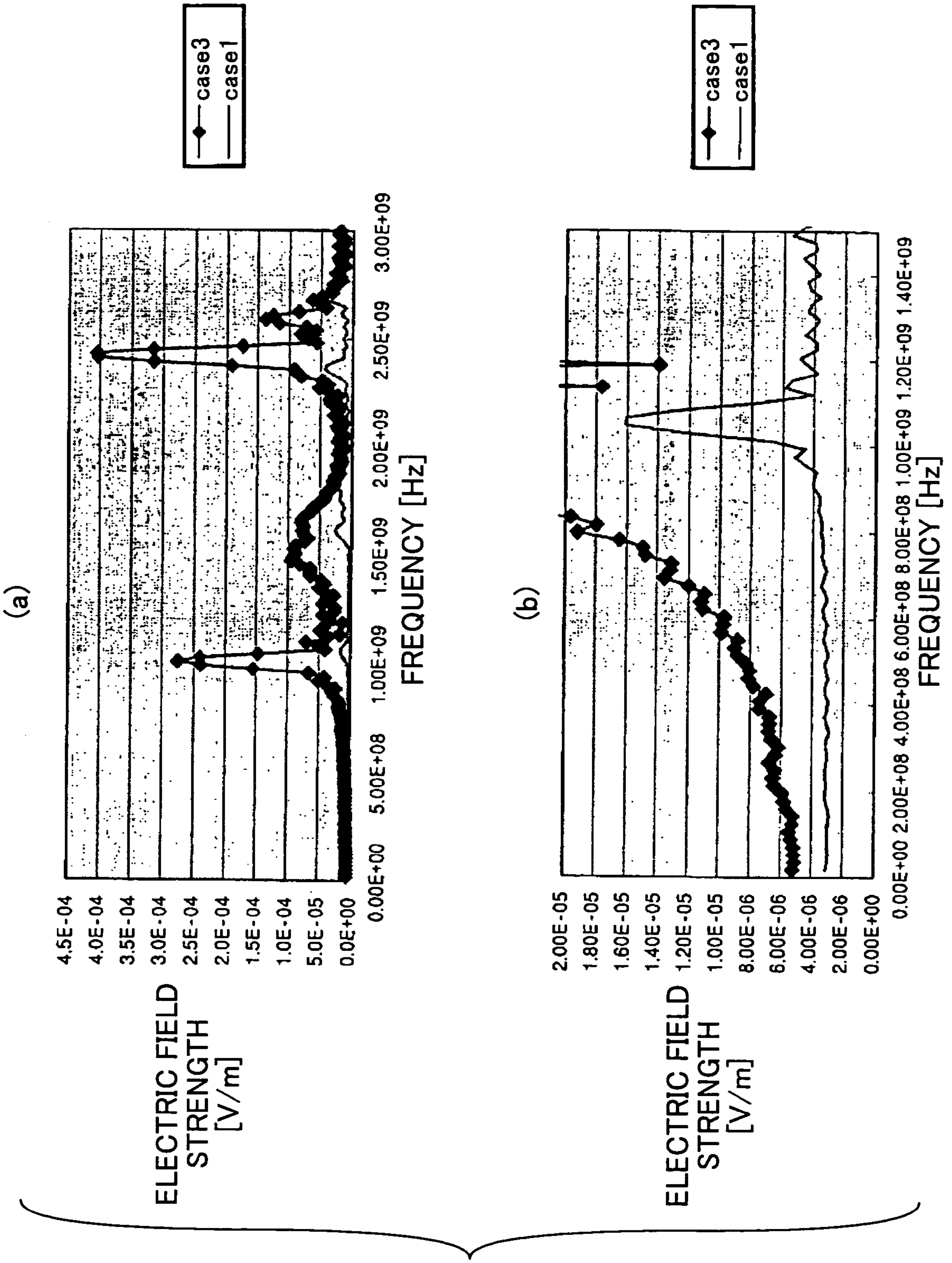
FIG. 9 contains graphs showing a frequency characteristic of radiation electrical field strength in a case where a metal housing is used as the housings shown in FIG. 1 and FIG. 4, more particularly.

FIG. 9-(*a*) shows radiation electrical field strength in a case of a frequency from 0 Hz to 3.00E+09 Hz (3 GHz), and FIG. 9-(*b*) shows radiation electrical field strength in a case of a frequency from 0 Hz to 1.50E+09 Hz (1.5 GHz). In this embodiment, $3.00\times10^9$ is represented as 3.00E+09.

As understood from FIG. 9-(*b*), in a case of the CASE 3, the electric field strength wherein the frequency is between 2.00E+08 Hz (200 MHz) and 1.00E+09 Hz (1 GHz), exceeds 6.00E−06 V/m. On the other hand, in a case of the CASE 1, the electric field strength wherein the frequency is between 2.00E+08 Hz (200 MHz) and 1.00E+09 Hz (1 GHz), is less than or equal to 3.00E−06 V/m. Thus, the CASE 1 has a shield effect twice or more than twice of the CASE 3 in the case where the frequency range between 2.00E+08 Hz (200 MHz) and 1.00E+09 Hz (1 GHz). As shown in FIG. 9-(*b*), a leakage electric field of the CASE 1 is substantially constant in the case of the frequency between 0.00E+00 Hz and 1.00E+08 Hz (1 GHz). Furthermore, the spaces having a slit shape cause a radiant heat effect.

As clearly shown by data of FIG. 9-(*a*), even in a case of a frequency higher than 1.061 GHz which is a lowest resonance frequency, the leakage electric field of the CASE 1 is lower than the leakage electric field of the CASE 3, and shield-ability against the CASE 1 is higher than shield-ability against the CASE 3.

Next, housings satisfying the above data were manufactured by way of trial and shield-abilities thereof were examined by measurement in an anechoic chamber.

A housing (CASE 1), as shown in FIG. 1, wherein a plurality of the spaces 3 having the slit shapes are provided radially from a center part so as to be along an induced electric current distribution at a housing surface, and a housing (CASE 3), as shown in FIG. 4, wherein a plurality of the spaces 3 having the slit shapes are provided so as to disturb the induced current generated along the revolving magnetic field distribution, were applied as housings manufactured by way of trial.

The above mentioned housings are formed by alumina. As a noise source, not printed boards but monopole antenna 2*b* shown in FIG. 10 was used instead of the board line.

Figure 10:
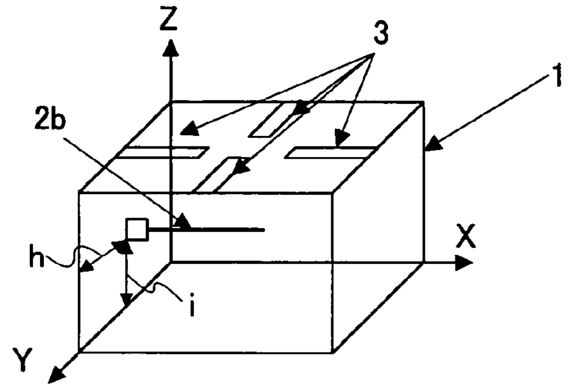
FIG. 10 is a perspective view showing a metal housing having been manufactured by way of trial for measuring shield-ability, and a monopole antenna provided at a noise source in the housing.

Regarding a position relationship between the monopole antenna 2*b* and the housing 1, as shown in FIG. 10, "h" is set as 100 mm, and "i" is set as 25 mm. In addition, lengths of the monopole antenna 2*b* were set as 33 mm and 83 mm because the radiant efficiency of the electromagnetic wave of the monopole antenna is changed by the frequency.

Figure 11:
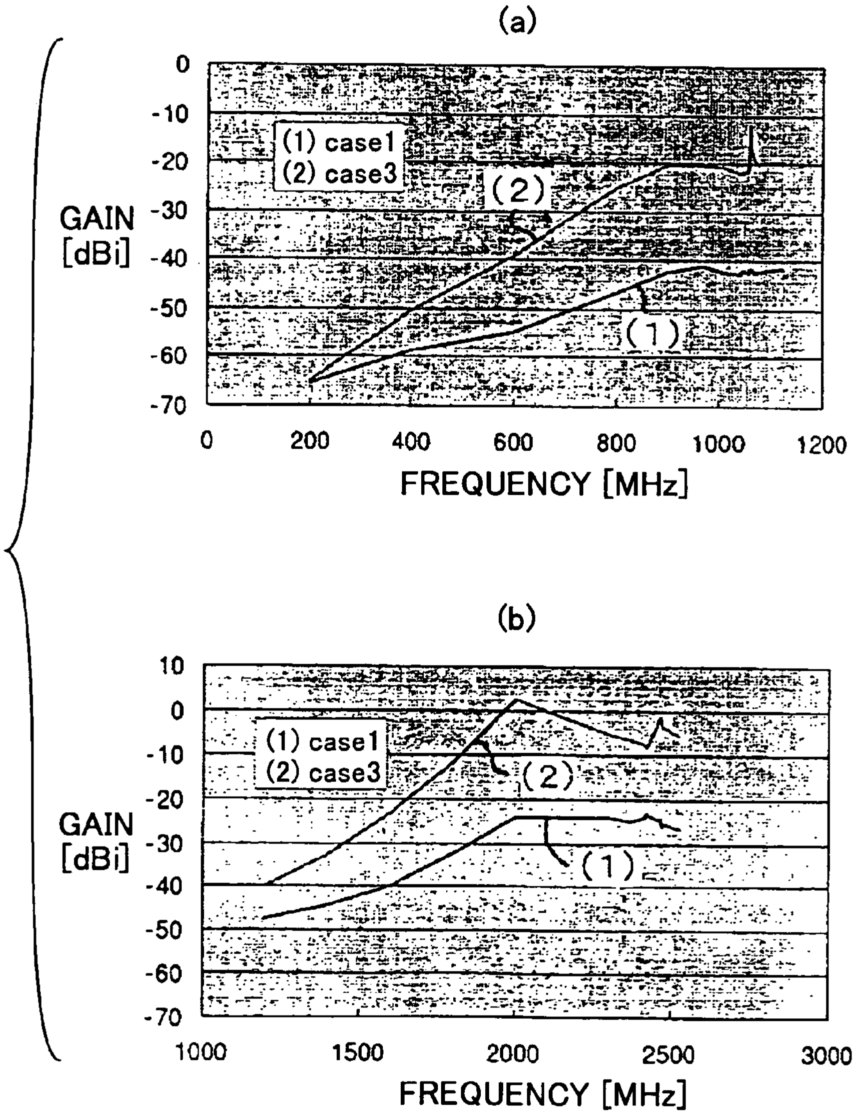
FIG. 11 contains graphs showing a result measured at an anechoic chamber by using two housings having structures shown in FIG. 1 and FIG. 3 in which the monopole antenna is provided as shown in FIG. 10; more particularly, FIG. 11-(*a*) shows gain in a case where the monopole antenna has a length of 83 mm and a range of the frequency is set 200 through 1120 MHz, and FIG. 11-(*b*) shows gain in a case where the monopole antenna has a length of 33 mm and a range of the frequency is set 1200 through 2520 MHz.

FIG. 11 shows a measurement result of the housing manufactured by way of trial in the anechoic chamber in which there is a 3 m length between a subject of measurement and a measurement antenna. FIG. 11-(*a*) shows gain in a case where the monopole antenna has the length of 83 mm and the range of the frequency is set 200 through 1120 MHz. FIG. 11-(*b*) shows gain in a case where the monopole antenna has the length of 33 mm and the range of the frequency is set 1200 through 2520 MHz.

In FIG. 11-(*a*) and FIG. 11-(*b*), a horizontal axis represents a frequency and a vertical axis represents absolute gain. As shown in FIG. 11-(*a*), the gain in the CASE 3 is approximately 20 dB higher than the CASE 1. It is found by using electric field conversion that the electromagnetic wave in the CASE 3 outputs easily as approximately 100 times the CASE 1.

In a case of 1058 MHz that is a peak frequency of the CASE 3, the gain of the CASE 3 is approximately 30 dB higher than the CASE 1. This means, by using electric field conversion, the electromagnetic wave in the CASE 3 outputs easily as approximately 100 times the CASE 1.

As described above, it is found that a leakage electric field of the CASE 1 is lower than a leakage electric field of the CASE 3, and shield-ability against the CASE 1 is higher than shield-ability against the CASE 3, through the housings actually manufactured by way of trial.

Thus, it is possible to cope with both an effect of radiant heat and a shield against the electromagnetic wave noise by a simple structure, namely a structure wherein a plurality of the spaces 3 is provided so that longitudinal directions of the spaces 3 are along a surface electric current distribution of the induced current 5 in a case where the spaces 3 are not provided at the housing 1, more specifically, a structure wherein a plurality of the spaces 3 having slit shapes is provided so that longitudinal directions of the spaces 3 are formed radially from a gush part or a concentration part of the surface electric current calculated by an above-discussed numerical formula (namely, a center part of the magnetic field 4 calculated by the above-discussed numerical formula in the housing). Furthermore, in a case where the housing 1 has a rectangular parallelepiped shape as shown in FIG. 1, it is possible to position the spaces 3 most properly with a simple calculation.

Second Embodiment

In the second embodiment, the housing 1 having a structure shown in FIG. 1 is formed by a material including a conductor or a semiconductor which has a volume resistivity of less than or equal to $10^4$ Ωcm. More specifically, the housing 1 is formed of a semiconductor such as silicon or a metal material such as aluminum or iron.

This is because even if the housing 1 is made by the semiconductor material, the surface electric current is generated at the housing by an inducing function based on a magnetic field distribution in the housing, and the shield effect of the electromagnetic wave can be expected.

Furthermore, in a case where the housing 1 is formed by the material including a conductor or a semiconductor which has a volume resistivity of less than or equal to $10^4$ Ωcm, the whole of the housing may be formed by theses materials, or only an internal or external surface may be formed by these materials. That is, in a case where the housing 1 is formed by an insulator such as plastic, as described below, a shield effect can be obtained forming a metal film on only the internal or external surface of the housing 1, or by applying a conductive agent on only the internal or external surface of the housing 1.

In a case where the housing 1 is made by the above mentioned material, as described above in the first embodiment, the spaces 3 are provided at the housing so that a surface electric current distribution in a case where the space is not provided at the housing is not changed. That is, longitudinal directions of a plurality of the spaces 3 having slit shapes are along a surface electric current distribution of the induced electric current 5 in a case where the spaces are not provided at the housing 1, and therefore a sufficient noise shielding effect can be expected. Thus, it is possible to cope with both an effect of radiant heat and a shield against the electromagnetic wave noise with a simple structure.

Furthermore, the measurement of the housing 1 is set so that the resonance frequency of the electromagnetic wave in the housing is generated only with higher frequencies higher than an upper limit frequency of the EMI regulation. As a result of this, high shield-ability can be obtained until the resonance frequency reaches 1 GHz as shown in the CASE 1 of FIG. 9-(*b*). Thus, it is possible to cope with both an effect of radiant heat and a shield against the electromagnetic wave noise with a simple structure, and a higher shield-ability effect can be obtained.

Third Embodiment

In the third embodiment of the present invention, a hole (hole forming part) other than the above-described space 3 is provided at the housing 1 having a structure shown in FIG. 1. The hole size is set so as to be less than or equal to one fourth, more preferably less than or equal to one tenth, of the length of an electromagnetic wave to be reduced.

For example, there is a description of the size of an opening part at the housing or the like and a shield effect, at page 99 of "Noise reduction techniques in electronic systems", Henry W. Ott. Although a shield effect of 20 dB can be obtained if the opening part has a size of one twentieth of a electromagnetic wavelength as an ideal, even if the opening part has a size of one fourth of the electromagnetic wavelength, a shield effect of 6 dB can be obtained. Furthermore, if the opening part has a size less than one tenth of the electromagnetic wavelength, a sufficient shield effect can be obtained. That is, in a case where the hole is set so as to have a size less than or equal to one fourth, more preferably less than or equal to one tenth, of the wavelength of an electromagnetic wave to be reduced, the effect of radiant heat can be obtained while the effect of the shield against the electromagnetic wave noise is improved.

Here, a shield effect, in a case where a hole having a size of one tenth of the wavelength λ, namely λ/10, is provided at the housing 1, is described.

According to the above-mentioned "Noise reduction techniques in electronic systems", Henry W. Ott, the shield effect is expressed by the following formula 3, wherein a maximum measurement of the hole provided at the housing is "L" and the wavelength is "λ".

$$S1=20\ \mathrm{Log}(\lambda/2L) \quad \text{(Formula 3)}$$

Here, for example, a shield effect of 20 dB means that the electric field strength outside of the housing is one tenth of the electric field strength of an inside of the housing.

Thus, a shield effect of a hole having a size of λ/10 can be expressed in the following formula 4 by setting L=λ/10.

$$S1=20\ \mathrm{Log}(10../2..)\approx 14 \quad \text{(Formula 4)}$$

Here, the above-mentioned formula 3 can be applied to a case where one hole is provided at the housing. An amount of reduction of the shield effect in a case where a number of "N" holes are provided at the housing is expressed by the following formula 5.

$$S2=-20\ \mathrm{Log}_{\surd}N \quad \text{(Formula 5)}$$

For example, a shield effect wherein five holes having a size of ../10 are provided at the housing is expressed by the following formula 6.

$$S1+S2=14-20\ \mathrm{Log}_{\sqrt{}}5=14-7=7 \qquad \text{(Formula 6)}$$

This result shows that a sufficient shield effect of 14 dB (namely, the electric field strength outside of the housing is one fifth of the electric field strength inside of the housing) can be obtained if only one hole having a size of λ/10 is provided, while a sufficient shield effect of 7 dB (namely, the electric field strength outside the housing is 1/2.2 of the electric field strength inside the housing) can be obtained if the five holes having sizes of λ/10 are provided. Hence, the more the number of the holes provided at the housing, the lower the shield effect.

Thus, in a case where the number of the holes provided at the housing is small such as just only one, a shield effect can be obtained even if the size of the hole is less than one fourth of the wavelength. However, in order to obtain sufficient shield effect, it is preferable that the size of the hole be less than one tenth of the wavelength. In addition, in a case where a plurality of the holes is provided at the housing, a hole is required to have a size less than one tenth of the wavelength. Because of this, it is possible to cope with both an effect of radiant heat and a shield against the electromagnetic wave noise, and estimate the shield effect in a case where the hole is formed in the structural body in advance.

Fourth Embodiment

In the fourth embodiment, a space having a slit shape or rectangular shape is provided at the housing, and a longitudinal direction of the space is set so that a surface electric current distribution in a case where the space is not provided at the housing is not changed. That is, as shown in FIG. 1, in a case where the spaces 3 having slit shapes are provided at the housing 1, the longitudinal directions of a plurality of the space 3 having slit shapes are along a surface electric current distribution of the induced electric current 5 in a case where the spaces are not provided at the housing 1.

For example, there is a description about the way to form an opening part at the housing, for example, at page 198 of "Noise reduction techniques in electronic systems", Henry W. Ott. It is discussed that a surface electric current distribution is disturbed by a slit having a rectangular configuration so that a shield effect is reduced, in the description.

In this embodiment, a longitudinal direction of the space having the slit shape or the rectangular shape is set so that a surface electric current distribution is not disturbed and therefore a high shield effect can be obtained. Hence, it is possible to cope with both an effect of radiant heat and a shield against the electromagnetic wave noise with a simple structure, and to position the space having a slit shape or rectangular shape most properly.

Fifth Embodiment

In the fifth embodiment, the space having a slit shape or a rectangular shape in the longitudinal direction is formed radially from a gush part or a concentration part of the surface electric current of the housing.

As shown in FIG. 1, in a case where the housing 1 has a rectangular parallelepiped configuration, a resonance frequency, or a gush part or a concentration part of the surface electric current of the housing part, namely a center part of the magnetic field, can be obtained analytically. Hence, it is possible to position a longitudinal direction of the space 3 so that the space in the longitudinal direction is formed radially from a gush part or a concentration part of the surface electric current of the housing.

Figure 12:
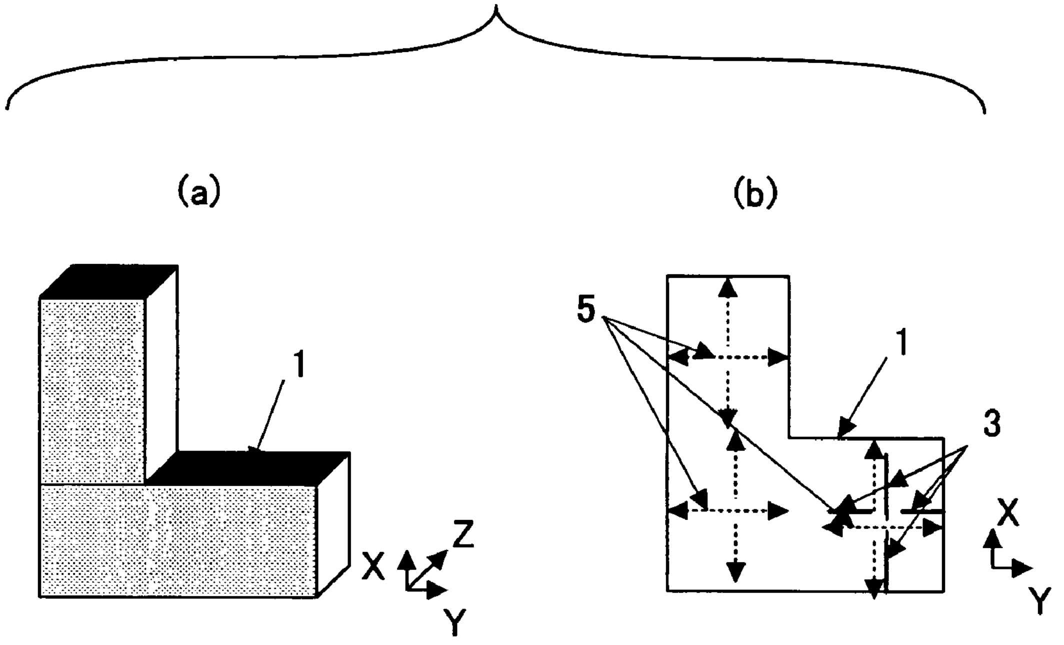
FIG. 12 is a view showing an arrangement example of a surface electric current distribution and a space in a case where the housing has an L-shaped configuration.

However, as shown in FIG. 12-(*a*), in a case where the housing 1 has an L-shaped configuration, a resonance frequency or a gush part or a concentration part of the surface electric current of the housing part, namely a center part of the magnetic field, cannot be obtained analytically. In this case, a numerical analysis such as the above-described FDTD method is performed or a vicinity magnetic distribution is calculation-analyzed so that a surface electric current distribution shown by a numerical mark 5 in FIG. 12-(*b*) is obtained. A longitudinal direction of the space 3 from a position of a gush part or a concentration part of the surface electric current of the housing part is radially set so that a shield effect can be improved. Thus, both an effect of radiant heat and a shield against the electromagnetic wave noise are coped with using a simple structure. In addition, even if the housing does not have a rectangular parallelepiped configuration, the surface electric current distribution can be calculated by a numerical analysis, so that it is possible to position the space most properly.

Sixth Embodiment

Figure 13:
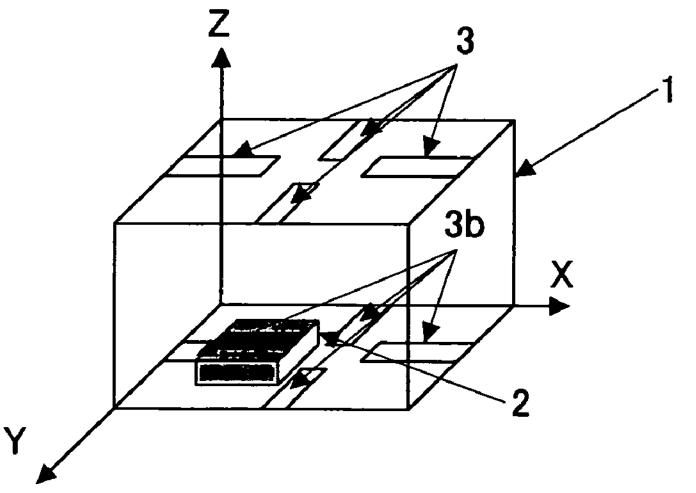
FIG. 13 is a perspective view showing an example wherein a plurality of space parts is provided at an upper or upper and lower parts of the housing.

Next, referring to FIG. 13, a sixth embodiment of the present invention wherein a plurality of the space parts is provided at an upper part of the housing or the upper or lower part of the housing is explained.

As shown in FIG. 13, the spaces 3 having slit shapes are provided at an upper part of the housing 1, and a plurality of the spaces 3*b* having slit shapes is provided at a bottom surface part of the housing 1.

Thus, since the spaces 3 having slit shapes are provided at the upper part and the bottom surface part of the housing 1, it is possible to achieve more effective radiant heat effect based on a convection current. The space having a slit shape may be provided only at the bottom surface part of the housing 1. Furthermore, in a case where a plurality of the spaces 3 having slit shapes is provided at an upper part of the housing 1, and a plurality of the spaces 3*b* having slit shapes is provided at a bottom surface part of the housing 1, it is possible to cope with both an effect of radiant heat and a shield against the electromagnetic wave noise with a simple structure, by forming the spaces 3 and 3*b* in the longitudinal directions radially from a gush part or a concentration part of the surface electric current of the housing 1.

Seventh Embodiment

In the seventh embodiment of the present invention, a connection part is provided at the housing so that a surface electric current in a case where the connection part is not provided at the housing is not changed.

Generally the connection part has a higher resistance value than the housing, and thereby the surface electric current is disturbed. Hence, it is possible to achieve a sufficient shield effect by providing the connection part at the housing so that a surface electric current in a case where the connection part is not provided at the housing is not changed. Thus, it is possible to cope with both an effect of radiant heat and a shield against the electromagnetic wave noise with a simple structure, and a high shield effect can be achieved even if the connection part is provided at the housing.

Figure 14:
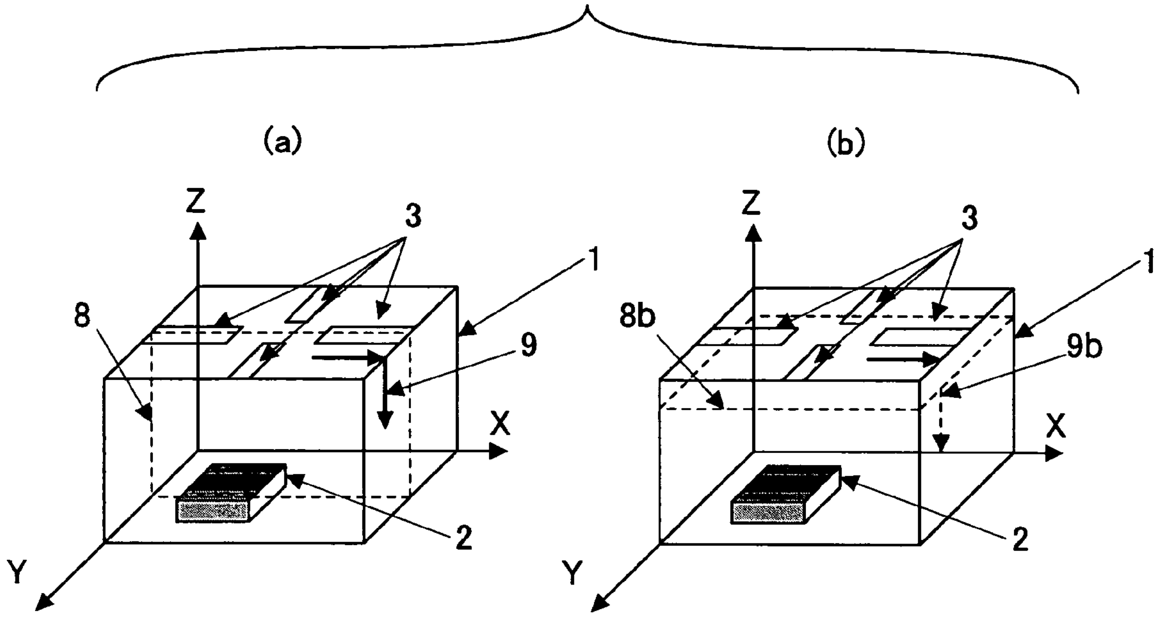
FIG. 14 is contains perspective views showing an example wherein a housing connection surface is provided along a longitudinal direction of the space part of the housing.

Here, referring to FIG. 14, a case where a housing connection part (a connection surface) for connecting the housing 1 is provided along a longitudinal direction of the space part 3 formed at the housing 1, is described.

A housing 1, an electronic apparatus (printed board) 2 installed in the housing 1, a plurality of the spaces 3 having slit shapes, a housing connection surface 8, and a generated induced electric current 9 are shown in FIG. 14-(*a*).

As long as the same housing configuration and frequency are provided to the case shown in FIG. 14-(*a*), the induced electrical current 9 is sent from a center of an upper part lid or to a center part only. Since the housing connection surface 8 is provided along the longitudinal direction of the space part 3 of the housing 1, a stable shield effect which is along the electric current is achieved by a simple conductive process.

FIG. 14-(*b*) shows a comparison example to the case shown in FIG. 14-(*a*). The housing connection surface **8*b* is perpendicular to the induced electrical current 9*b*. If the conductive process to the housing connection surface 8*b*** is incomplete, the induced electric current is not sent sufficiently and thereby the shield-ability cannot be obtained.

Therefore, it is possible to achieve a stable reduction effect of electromagnetic wave noise even if conductivity of the housing connection part is bad, by providing the housing connection surface so as to be along a longitudinal direction of the spaces 3 formed radially.

Thus, in this embodiment, a connection part is provided at the housing so that a surface electric current in a case where the connection part is not provided at the housing is not changed.

As described above, a shield effect is reduced due to disturbance of the surface electric current by a slit having a rectangular shape. Similarly and generally, a shield effect is reduced due to disturbance of the surface electric current by a connection part with a longitudinal direction.

Hence, in a case where the connection has a longitudinal direction, as described above, it is possible to improve the shield effect by providing the longitudinal direction of the connection part so as to not disturb the surface electric current. Hence, it is possible to cope with both an effect of radiant heat and a shield against the electromagnetic wave noise, and most proper positioning can be done even if the connection part has the longitudinal direction.

Eighth Embodiment

In the eighth embodiment of the present invention, the connection part in the longitudinal direction is formed radially from a gush part or a concentration part of the surface electric current of the housing.

In a case where the housing 1 has a rectangular parallelepiped configuration, a resonance frequency or a gush part or a concentration part of the surface electric current of the housing part, namely a center part of the magnetic field, can be obtained analytically.

Figure 15:
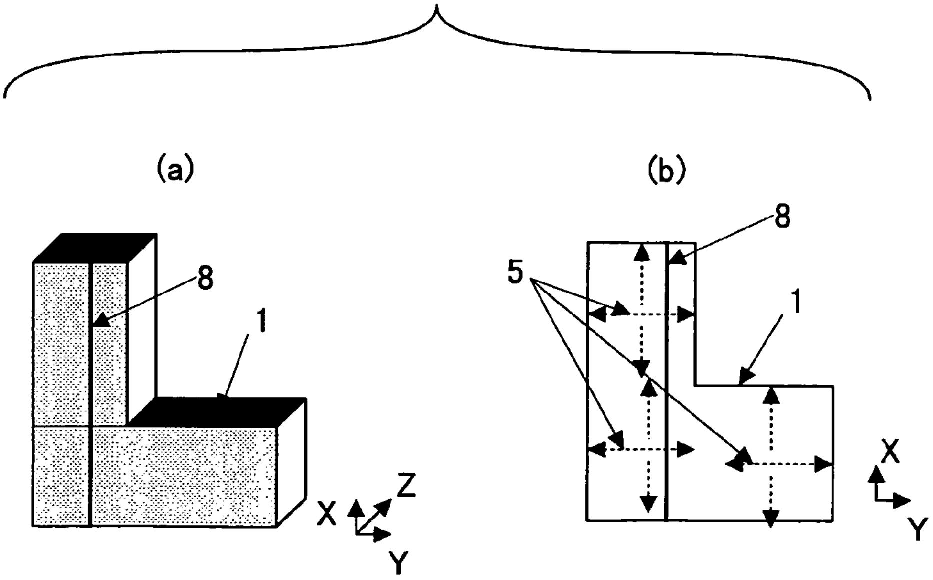
FIG. 15 contains views showing an arrangement example of the surface electric current distribution and the connection part, in a case where the housing has the L-shaped configuration.

However, as shown in FIG. 15-(*a*), in a case where the housing 1 has an L-shaped configuration, a resonance frequency or a gush part or a concentration part of the surface electric current of the housing part, namely a center part of the magnetic field, cannot be obtained analytically. In this case, a numerical analysis such as the above-described FDTD method is performed or a vicinity magnetic distribution is calculation-analyzed so that a surface electric current distribution shown by a numerical mark 5 in FIG. 15-(*b*) is obtained. A longitudinal direction of the housing connection part 8 from a position of a gush part or a concentration part of the surface electric current of the housing part is radially set so that a shield effect can be improved. Thus, an effect of radiant heat and a shield against the electromagnetic wave noise can be coped with using a simple structure. In addition, even if the housing does not have a rectangular parallelepiped configuration, the surface electric current distribution can be calculated by a numerical analysis, so that it is possible to position the connection part 8 most properly.

In a case where the housing 1 has a rectangular parallelepiped configuration, a resonance frequency or a gush part or a concentration part of the surface electric current of the housing part, namely a center part of the magnetic field, can be obtained analytically. It is possible improve a shield effect by arranging the connection part 8 radially from the gush part or concentration part of the surface electric current as well as a case shown in FIG. 14-(*a*). Hence, it is possible to cope with both an effect of radiant heat and a shield against the electromagnetic wave noise, and to position the connection part with a simple calculation most properly in a case where the housing has a rectangular parallelepiped configuration.

Ninth Embodiment

Figure 16:
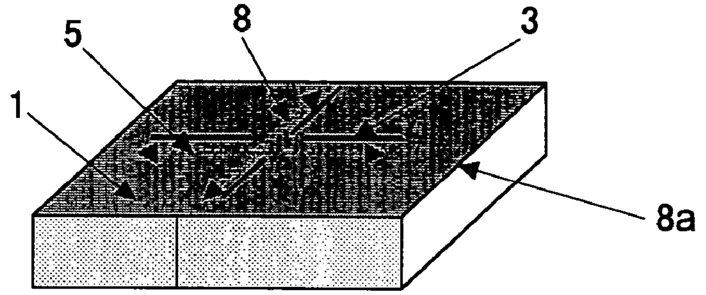
FIG. 16 is a perspective view showing an arrangement example of connection parts wherein a connection part having bad electric resistance and a connection part having good electric resistance are provided at the housing part.

The ninth embodiment of the present invention is discussed with reference to FIG. 16. A housing 1, a plurality of spaces 3 having slit shapes provided at an upper part of the housing 1, a surface electric current 5 generated at the upper part of the housing 1, a connection part 8 having bad electric resistance (which has a large contact resistance, an unevenness resistance depending on a connection position, and bad conductivity) and a connection part 8 having good electric resistance (which has a small contact resistance, a small unevenness resistance depending on a connection position, and good conductivity) are shown in FIG. 16. In a case where the housing 1 in which an electronic apparatus is installed is manufactured, it is difficult to actually manufacture only one connection part such as the connection part 8 and therefore it causes increasing of cost. Hence, at the time of manufacturing, the upper part of the housing 1 is made to have a lid shape. The upper part lid can be removed so that the connection part is provided at a position by which the numerical mark **8*a* is indicated in FIG. 16. However, if a housing main body and the upper part lid are connected mechanically such as by using screw-fixing, the contact resistance at the connection part 8*a* is made large and unevenness of the resistance occurs depending on the contacting position so that an induced electric current generated at the upper part lid may be disturbed. That is, as described in the seventh embodiment, the connection part 8*a* between the housing main body and the upper part lid faces a direction perpendicular to the induced electric current generated at the upper part lid. Therefore, an electric current is largely disturbed at the connection part so that the shield effect can be weakened. If the housing main body and the upper part lid are connected by welding or sealing with solder, good conductivity can be obtained and shield-ability can be improved. It is not preferable to apply welding or soldering after the electronic apparatus is installed in the housing because a bad influence due to heat is given to the electronic apparatus. Therefore, it is required to mechanically connect the housing main body and the upper part lid. In this case, a contact resistance at the connection part 8*a* can be drastically reduced by putting a conductive gasket, for example, at the contact part 8*a*. Also, it is possible to reduce the resistance unevenness at the contact position by managing the torque of screw fixing, so that a connection part having good electric resistance is obtained. If the connection part 8*a* at which the conductive gasket is put is opened and closed only at the time of manufacturing, it is possible to maintain a good electric resistance state and provide conductivity. In a case where the housing is opened and closed at the time of maintenance, for example, the connection part 8** having bad electric resistance is used. Because of this, it is possible to improve a shield effect in which the manufacturing cost is reduced.

As shown in FIG. 16, in a case where the housing 1 has a connection part 8*a* having good electrical resistance and a connection part 8 having bad electrical resistance, the connection part 8 having bad electrical resistance in a longitudinal direction is along a surface electric current distribution in a case where the connection part 8 having bad electrical resistance is not provided at the housing. More specifically, as described in the seventh embodiment, the connection part 8 having bad electrical resistance in a longitudinal direction is formed radially from a gush part or a concentration part of the surface electric current of the housing. That is, the connection part 8 having bad electrical resistance is positioned as well as the space 3 having a slit shape.

Particularly, in a case where the housing 1 has a rectangular parallelepiped shape, the connection part having the bad electrical resistance in the longitudinal direction is formed radially from a gush part or a concentration part of the surface electric current calculated by the above mentioned numerical formula. Because of this, it is possible to cope with both an effect of radiant heat and high shield-ability against the electromagnetic wave noise under a simple structure. Furthermore, it is possible to provide a housing easily manufactured by arranging a position of the connection part so that the surface electric current distribution is prevented from being disturbed.

Tenth Embodiment

In the above mentioned embodiments, the space is arranged radially from a gush part or a concentration part of the surface electric current and in a direction which a flow of a cooling medium for elimination of heat or air change is not disturbed. That is, radiant heat by the space 3 and a convection current of inside air are calculated by a numerical analysis and a measurement analysis. Based on a result of them, it is possible to arrange the most proper position. Thus, it is possible to improve the radiant heat effect, while a shield effect is improved. Hence, it is possible to cope with both an effect of radiant heat and high shield-ability against the electromagnetic wave noise by arranging a position of the space 3 most properly, and to further improve the radiant heat effect

Eleventh Embodiment

Next, a case where a pipe for communicating between the inside and the outside of the housing 1 having a similar structure with the housing shown in FIG. 1 is provided at the housing 1, and the width of an opening part of the pipe is set so as to be less than or equal to a half of the wavelength of a frequency to be reduced, is described with reference to FIG. 17.

Figure 17:
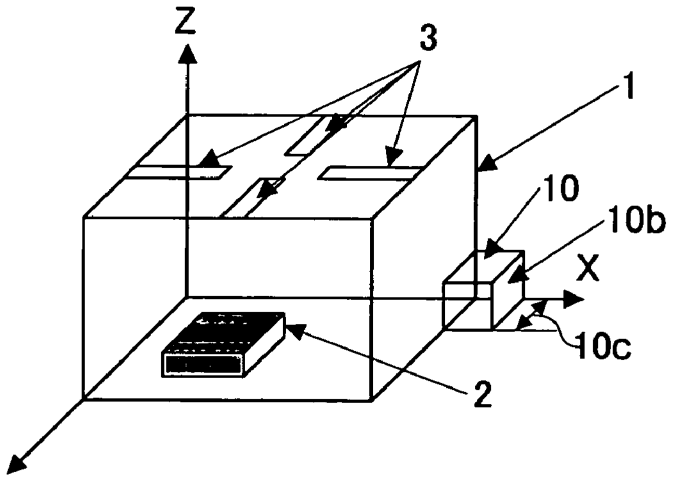
FIG. 17 is a perspective view showing an example wherein a tube, which connects an inside and an outside of the housing, is provided at the housing.

A pipe 10 is shown in FIG. 17. A numerical mark 10*c* shows the width of an opening part 10*b* of the pipe 10. It is assumed that the height of the opening part 10*b* of the pipe is larger than the width 10*c* of the opening part 10*b*. Generally, the electro magnetic wave does not transfer to a metal rectangular waveguide pipe having a width less than a half wavelength of the magnetic wave. If an upper limit frequency of the EMI regulation is set to have 1 GHz, a half wavelength is set as 0.165 m. If the measurement of the width 10*c* of the opening part 10*b* is set as 0.165 m, an electromagnetic wave having a frequency less than 1 GHz does not leak from the opening part 10*b*, and therefore a signal line of an electronic apparatus such as the printed board can be pulled out.

Therefore, it is possible to prevent the electromagnetic wave having a frequency lower than a frequency to be reduced from leaking from the pipe 10 such as a metal pipe provided at the housing 1 for passing the signal line by setting the size of the width 10C of the opening part 10*b* of the pipe 10 as a length less than or equal to the half of the wavelength of the frequency to be reduced.

Twelfth Embodiment

Next, the twelfth embodiment is explained with reference to FIG. 18.

Figure 18:
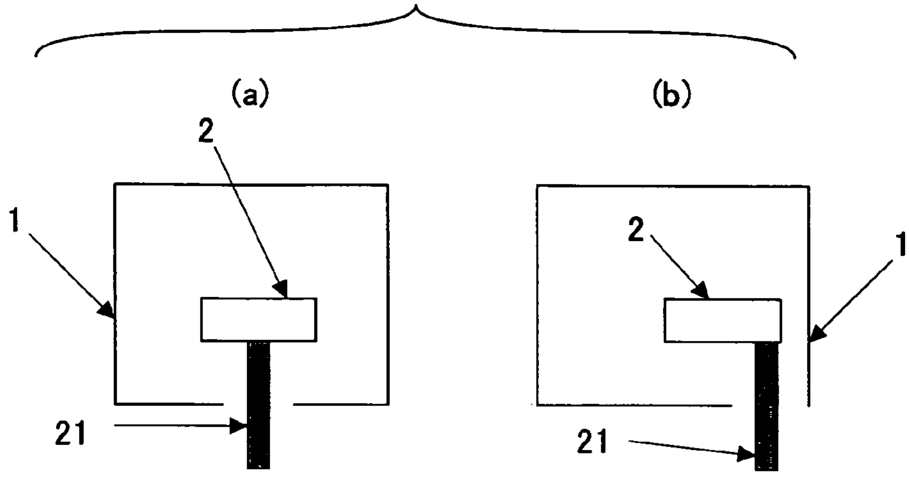
FIG. 18 contains schematic diagrams of an arrangement example wherein a harness or an electrical wire or cord is provided at the housing.

In FIG. 18, a housing 1, a printed board 2 which is one example of an electronic apparatus, and a harness 21 (or electrical wire or cord) extending from the printed board 2, are shown. In a case where a harness 21 (or an electrical wire or cord) for communicating information or electric power between the electric apparatus situated at the inside of the housing and the outside of the housing, is provided at the housing, if the harness 21 (or electrical wire or cord) is provided as shown in FIG. 18-(*a*), based on a boundary condition of the harness 21 (or electrical wire or cord), a magnetic field distribution of the inside of the housing is disturbed so that the surface electric current is also disturbed. Hence, in this embodiment, the harness 21 (or electrical wire or cord) for communicating information or electric power between the electric apparatus situated at the inside of the housing and the outside of the housing, is provided at the housing 1, so as to not disturb a surface electrical current distribution in a case where the harness (or electrical wire or cord) is not provided at the housing 1. More specifically, as shown in FIG. 18-(*b*), it is possible to reduce the disturbances of the magnetic field in the housing and the surface electric current by providing the harness 21 (or electrical wire or cord) close to a wall surface of the housing 1, so that a good shield effect can be achieved even if the harness (or electrical wire or cord) is put to the housing. Hence, it is possible to cope with both an effect of radiant heat and a shield against the electromagnetic wave noise with a simple structure, and to obtain a good shield effect even if the harness (or electrical wire or cord) is put to the housing.

Thirteenth Embodiment

Figure 19:
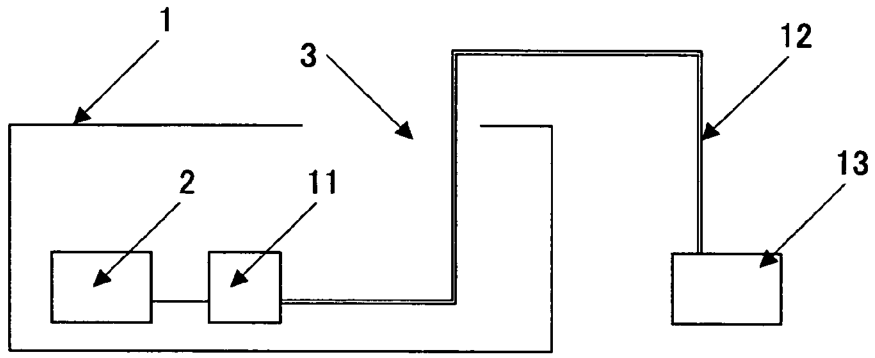
FIG. 19 is a schematic diagram showing an example wherein an electric optical conversion element, an optical electric conversion element, and an optical fiber are provided at the housing.

Referring to FIG. 19, in the thirteenth embodiment, an electric optical conversion element for converting an electric signal to an optical signal, an optical electric conversion element for converting the optical signal to an electric signal, and an optical fiber, are provided at the housing having a similar structure with a structure shown in FIG. 1.

The electric optical conversion element 11, the optical fiber 12, and the optical electric conversion element 13 are provided in FIG. 19. The electric optical conversion element 11 converts an electric signal of the electric apparatus 2 such as the printed board to an optical signal. The optical signal converted by the electric optical conversion element is sent from the space 3 having the slit shape to an outside of the housing by the optical fiber 12, and then converted to the electric signal by the optical electric conversion element 13. Because of this structure, it is possible to communicate a signal between the inside and outside of the housing and to avoid leakage of an electromagnetic wave from an opening part for signal transmission at all frequencies.

That is, in this embodiment, the electric optical conversion element is connected to an electric apparatus installed inside of the housing, an optical fiber connected to the electric optical conversion element is extended out from the space part formed at the housing, and the optical electric conversion element is connected to the optical fiber. Because of this structure, the electric signal of the electric apparatus is converted to the optical signal by the electric optical conversion element, the converted optical signal is sent from the space to the optical electrical conversion element provided at the outside part of the housing and is converted to the electric signal by the optical electric conversion element. As a result of this, the signal is better communicated between the electric apparatus situated at the inside of the housing and the outside of the housing, and it is possible to avoid a leakage of an electromagnetic wave from an opening part for signal transmission at all frequencies.

Fourteenth Embodiment

Figure 20:
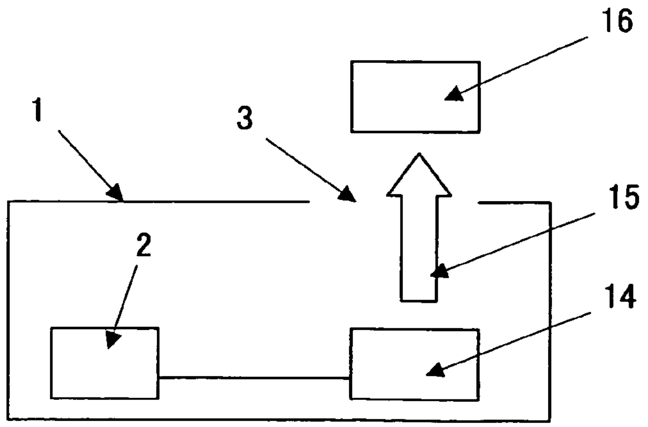
FIG. 20 is a schematic diagram showing an example wherein an electric infrared conversion element, and an infrared electric conversion element are provided at the housing.

Referring to FIG. 20, in the fourteenth embodiment, an electric infrared conversion element for converting an electric signal to an infrared signal, and an infrared electric conversion element for converting the infrared signal to an electric signal are provided at the housing having a similar structure with a structure shown in FIG. 1.

The electric infrared conversion element 14, a radiated infrared signal 15, and the infrared electric conversion element 16 are provided in FIG. 20. The electric infrared conversion element 14 converts an electric signal of the electric apparatus 2 such as the printed board to the infrared signal 15. The infrared signal 15 converted by the electric infrared conversion element 14 is sent from the space 3 having the slit shape to the outside of the housing, and then converted to the electric signal by the infrared electric conversion element 15. Because of this structure, it is possible to communicate a signal between the inside and outside of the housing and to avoid leakage of an electromagnetic wave from an opening part for signal transmission at all frequencies. Furthermore, it is possible to perform the above with a low cost.

That is, in this embodiment, the electric infrared conversion element is connected to an electric apparatus installed inside of the housing, and the infrared signal radiated from the electric infrared conversion element is sent to the infrared electric conversion element provided at the outside of the housing via the space and converted to the electric signal by the optical infrared conversion element. As a result of this, the signal is communicated between the electric apparatus situated at the inside of the housing and the outside of the housing, and it is possible to avoid leakage of an electromagnetic wave from an opening part for signal transmission at all frequencies.

Fifteenth Embodiment

Figure 21:
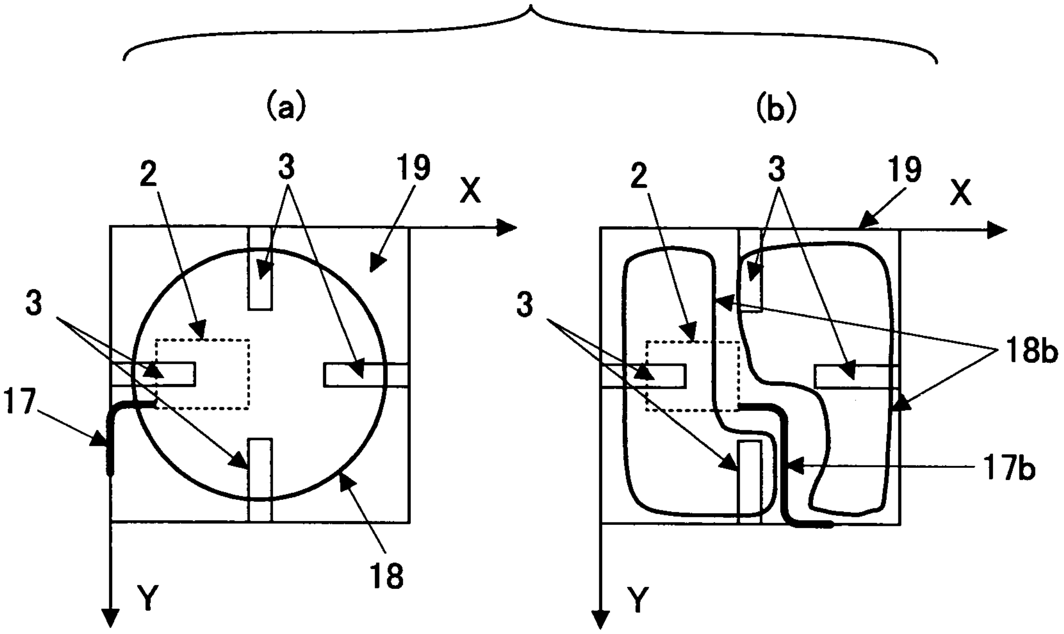
FIG. 21 contains schematic diagram showing an example wherein a heat pipe is provided at the housing.

Next, referring to FIG. 21, the fifteenth embodiment in which a heat pipe is provided at a housing 1 having the same structure as the structure shown in FIG. 1, is discussed.

A heat pipe 17 and a generated magnetic field 18 are shown in FIG. 21-(*a*). Heat generated from an electronic apparatus 2 such as a printed board is made to escape to a housing wall surface 19 by a heat pipe 17. In this case, the heat pipe 17 is provided so as to be along the housing wall surface 19 as close as possible. Generally, a surface of the heat pipe is made by metal, and therefore a magnetic field is distributed in a state where a metal surface is in a tangent direction. However, since the heat pipe 17 is provided so as to be along the housing wall surface 19, the magnetic field distribution 18 is almost not disturbed. Thus, further radiant heat effect can be obtained, and the magnetic field distribution is not disturbed and thereby a reduction of the shield effect due to the heat pipe does not happen. FIG. 21-(*b*) is a comparison example of FIG. 21-(*a*). In FIG. 21-(*b*), a heat pipe 17*b* is not provided along with the housing wall surface 19 but provided across a center of the housing. Hence, the magnetic field distribution 18*b* is disturbed a lot.

Therefore, the radiant heat effect is improved and a disturbance of the magnetic field by the heat pipe and a reduction of shield-ability from the electromagnetic wave can be prevented by providing a heat pipe for connecting an electronic apparatus provided in the housing, along the housing wall surface.

Sixteenth Embodiment

In the sixteenth embodiment, the housing 1 of the first through fifteenth embodiments is formed by a metal. The surface electric current is sent well and a high shield effect can be achieved by forming the housing 1 with the metal. Hence, it is possible to cope with both an effect of radiant heat and a shield against the electromagnetic wave noise, and a high shield effect can be achieved.

Seventeenth Embodiment

In the seventeenth embodiment, the housing 1 of the first through fifteenth embodiments, the housing has an internal surface or external surface where a thin film formed by a conductor is applied. That is, even if a main material by which the housing 1 is formed is an insulator, shield-ability against the electromagnetic wave noise can be obtained by applying the thin film formed by the conductor to the internal surface or external surface of the housing 1. More specifically, the housing is formed by a material having a volume resistivity of more than or equal to $10^8$ Ωcm, and the housing has an internal surface or external surface where a thin film formed by a material having a volume resistivity of less than or equal to $10^{-4}$ Ωcm is applied. As the material having a volume resistivity of more than or equal to $10^8$ Ωcm, a plastic material can be used. Also, as the material having a volume resistivity of less than or equal to $10^{-4}$ Ωcm, metal can be used.

Because of the above-described structure of the housing, the housing can be formed by plastic which can be easily manufactured. Also, a shield effect of the electromagnetic wave noise and the radiant heat effect that are similar to the effects obtained by the metal housing of the fifteenth embodiment can be obtained.

Next, an actual effect, in a case where a plastic housing having an inside on which a metal thin film is applied, is examined by simulation.

Figure 22:
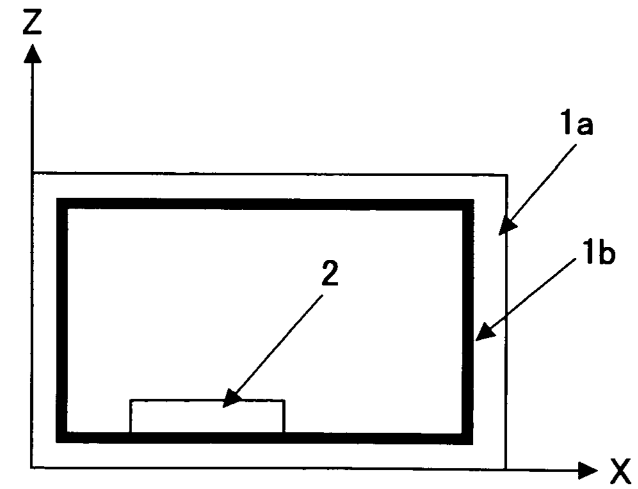
FIG. 22 is a side view showing an example wherein a metal thin film is applied to the housing.

As shown in FIG. 22 which is a cross-sectional view of the plastic housing 1*a*, a metal thin film layer 1*b* is applied to an internal surface side of the plastic housing 1*a*. A printed board 2 is installed in an inside part of the plastic housing 1*a*. The housing of this embodiment has a similar structure with the structure of the housing 1 of the first embodiment.

Radiation electrical field strengths of a configuration (CASE 1) with the spaces 3 having the slit shape formed radially from a center part as in FIG. 1, a configuration (CASE 2) having no lid at all at the upper part of the housing as shown in FIG. 3, and a configuration (CASE 3) disturbing the induced current generated so as to be perpendicular to the revolving magnetic field distribution as the space 7 having the slit shape in FIG. 4, are calculated. Measurement configurations of FIG. 1, FIG. 3 and FIG. 4 are shown in FIG. 5, FIG. 6, and FIG. 7. Here, "a" is 200 mm, "b" is 200 mm, "d" is 85 mm, "e" is 35 mm, "f" is 70 mm, and "g" is 5 mm. The dielectric constant of the plastic is 3 and the plastic has a thickness of 5 mm.

Here, like the first embodiment, an evaluation is implemented by a simulation of a numerical analysis method which is called the Finite Difference Time-Domain method (FDTD method).

Figure 23:
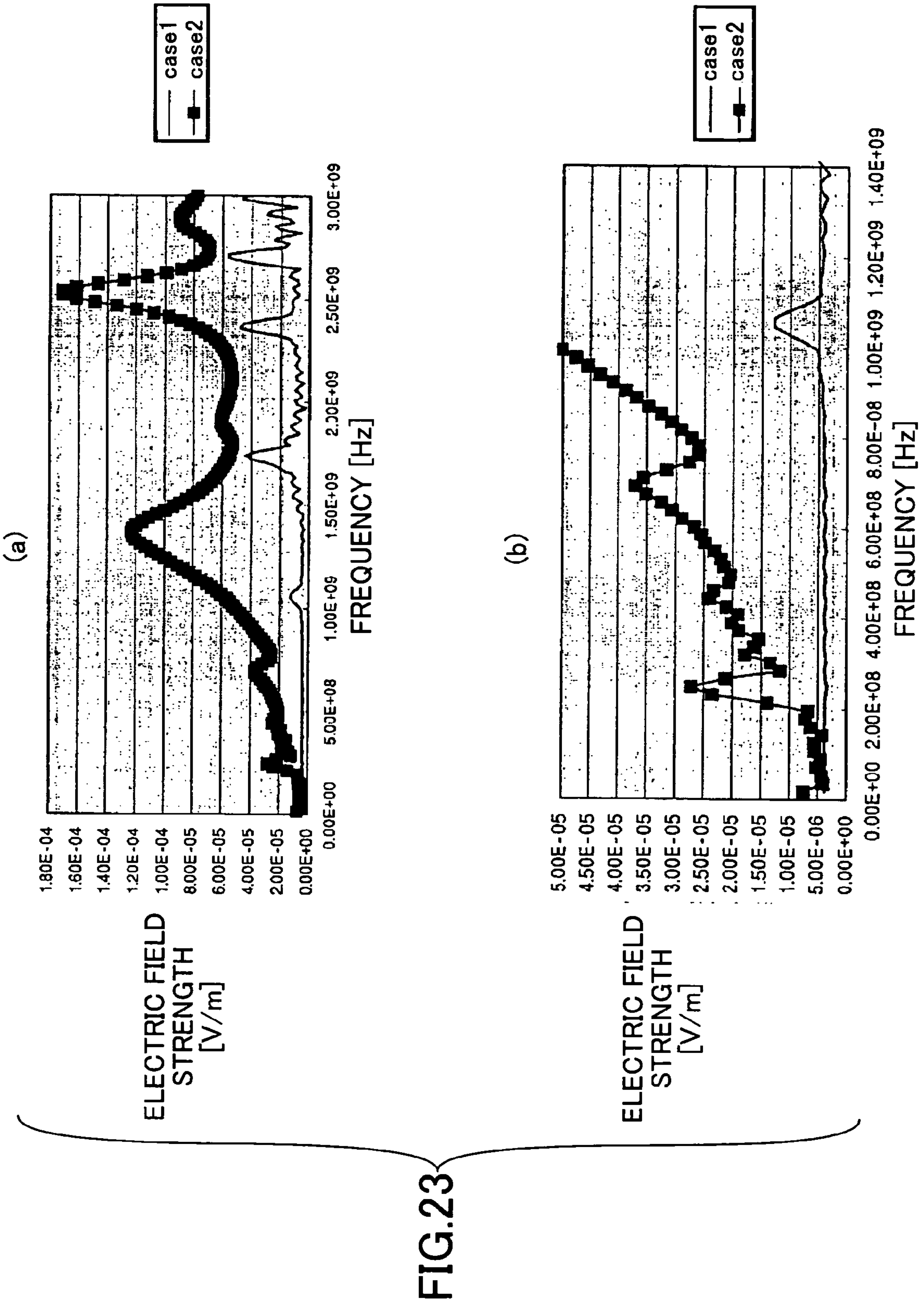
FIG. 23 contains graphs showing a frequency characteristic of radiation electrical field strength in a case where a plastic housing to which a metal thin film layer is applied is used as the housings shown in FIG. 1 and FIG. 3, more particularly.

First, radiation electrical field strengths of CASE 1 shown in FIG. 1 and CASE 2 (comparison example) shown in FIG. 3 are calculated from an electric field in the right upper part of the lid of the housing. The radiation electrical field strengths of CASE 1 shown in FIG. 1 and CASE 2 are shown in FIG. 23. FIG. 23-(*a*) shows radiation electrical field strength in a case of a frequency from 0 Hz to 3.00E+09 Hz (3 GHz), and FIG. 23-(*b*) shows a radiation electrical field strength in a case of a frequency from 0 Hz to 1.40E+09 Hz (1.4 GHz).

As understood from FIG. 23-(*b*), in a case of the CASE 2 wherein the lid is opened, the electric field strength wherein the frequency is between 2.00E+08 Hz (200 MHz) and 1.00E+09 Hz (1 GHz), exceeds 1.00E−05 V/m. On the other hand, in a case of the CASE 1, the electric field strength wherein the frequency is between 2.00E+08 Hz (200 MHz) and 1.00E+09 Hz (1 GHz), is less than or equal to 4.00E−06 V/m. Thus, the CASE 3 wherein the spaces have a slit shape radially from the center part of the housing 1 of the CASE 1 has a shield effect twice or more than twice of the CASE 2 wherein the lid is not provided at the housing, in the case where the frequency ranges between 2.00E+08 Hz (200 MHz) and 1.00E+09 Hz (1 GHz).

Figure 24:
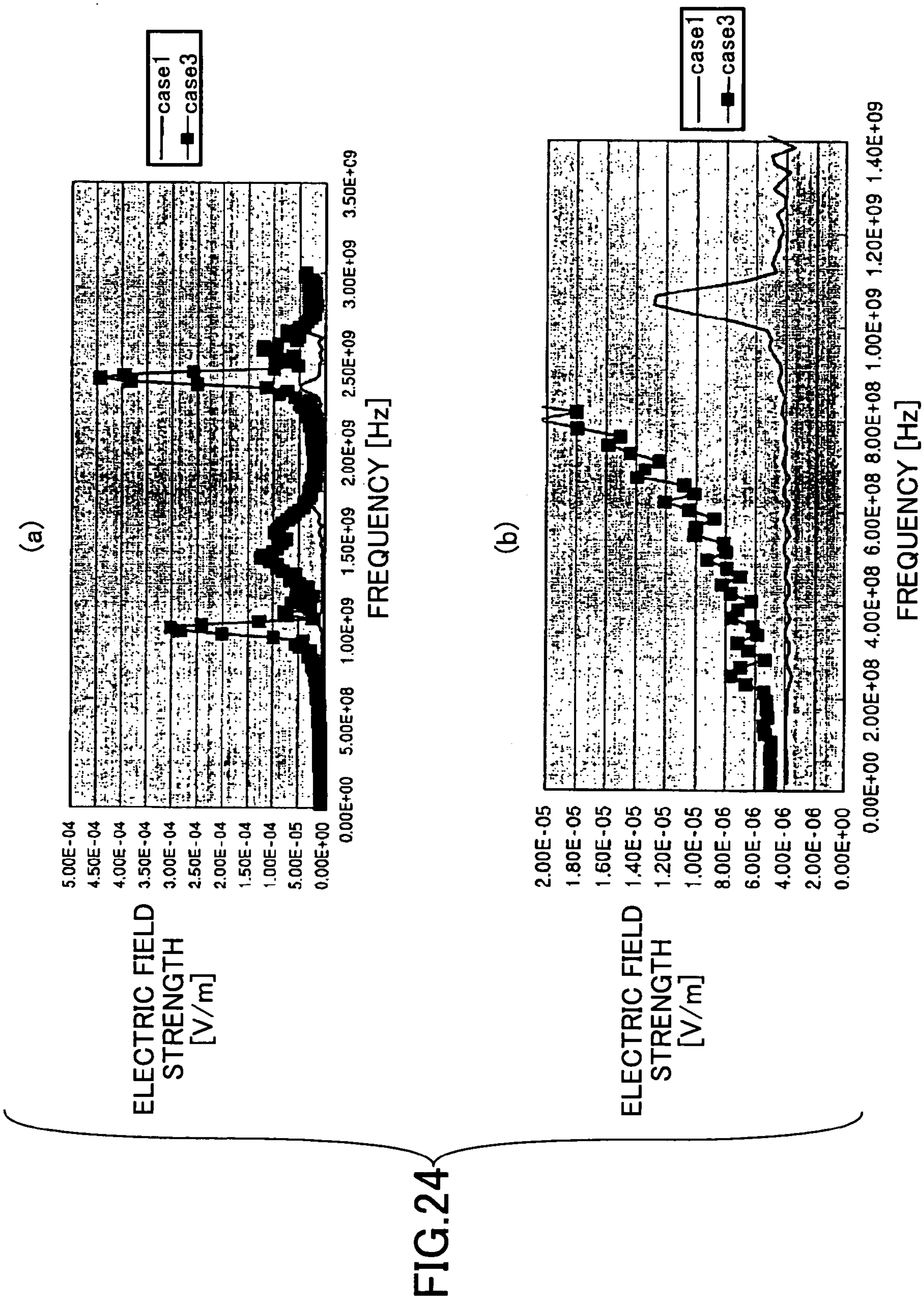
FIG. 24 contains graphs showing a frequency characteristic of radiation electrical field strength in a case where a plastic housing to which a metal thin film layer is applied is used as the housings shown in FIG. 1 and FIG. 4, more particularly.

Next, radiation electrical field strengths of CASE 1 shown in FIG. 1 and CASE 3 (comparison example) shown in FIG. 4 are calculated from an electric field in the right upper part of the lid of the housing. The radiation electrical field strengths of CASE 1 shown in FIG. 1 and CASE 3 are shown in FIG. 24. FIG. 24-(*a*) shows radiation electrical field strength in a case of a frequency from 0 Hz to 3.00E+09 Hz (3 GHz), and FIG. 24-(*b*) shows radiation electrical field strength in a case of a frequency from 0 Hz to 1.40E+09 Hz (1.4 GHz).

As understood from FIG. 24-(*b*), in a case of the CASE 3, the electric field strength wherein the frequency is between 5.00E+08 Hz (500 MHz) and 1.00E+09 Hz (1 GHz), exceeds 8.00E−06 V/m. On the other hand, in a case of the CASE 1, the electric field strength wherein the frequency is between 2.00E+08 Hz (200 MHz) and 1.00E+09 Hz (1 GHz), is less than or equal to 4.00E−06 V/m. Thus, the CASE 1 has a shield effect twice or more than twice of the CASE 3 in the case where the frequency ranges between 5.00E+08 Hz (500 MHz) and 1.00E+09 Hz (1 GHz). As shown in FIG. 24-(*b*), a leakage electric field of the CASE 1 is substantially constant in the case of the frequency between 0.00E+00 Hz and 1.00E+08 Hz (1 GHz). Furthermore, the space having a slit shape causes a radiant heat effect.

As clearly shown by data of FIG. 24-(*a*), even in a case of a frequency higher than 1.061 GHz which is a lowest resonance frequency, a leakage electric field of the CASE 1 is lower than a leakage electric field of the CASE 3, and shield-ability against the CASE 1 is higher than shield-ability against the CASE 3.

Eighteenth Embodiment

In the eighteenth embodiment, a thickness of the thin film of the seventeenth embodiment is greater than a skin depth of a skin effect at a lower limit frequency under an electromagnetic interference (EMI) regulation. More particularly, the surface electric current is sent to the metal thin film layer smoothly and therefore a high shield effect can be achieved by making the thickness of the metal thin film layer greater than or equal to several tens of μm. Because of this, it is possible to cope with both an effect of radiant heat and high shield-ability against the electromagnetic wave noise under a simple structure. In addition, since the thickness of the thin film payer can be estimated in advance, it is possible to obtain an effective shield effect.

Nineteenth Embodiment

In the nineteenth embodiment, the thin film layer in the seventeenth and eighteenth embodiments is glued to the housing via an adhesion layer, and a sticking part of the thin film, for gluing the thin film layer, is provided in a direction along a surface electric current distribution of the housing in a case where the sticking part is not provided. Because of this, it is possible to easily form a metal thin film layer by gluing the metal tape to the inside part of the plastic housing. Hence it is possible to obtain a high shield effect while manufacturing is done easily. It is possible to use a metal tape which is cheap, for example, as the thin film layer. Hence, it is possible to cope with both an effect of radiant heat and high shield-ability against the electromagnetic wave noise under a simple structure.

Twentieth Embodiment

In the twentieth embodiment, the sticking part of the thin film layer of the nineteenth embodiment in the longitudinal direction is formed radially from a gush part or a concentration part of the surface electric current of the housing. Because of this arrangement, it is possible to easily form a metal thin film layer by gluing the metal tape to the inside part of the plastic housing. Hence it is possible to obtain a high shield effect while manufacturing is done easily. It is possible to properly arrange a position where the metal tape is put with a numerical analysis for example, even in a case where a metal tape is used as the thin film layer. Hence, it is possible to cope with both an effect of radiant heat and high shield-ability against the electromagnetic wave noise under a simple structure.

Twenty First Embodiment

The housing in the 21st embodiment has a rectangular parallelepiped shape, and the sticking part for the thin film layer in the longitudinal direction is formed radially from a gush part or a concentration part of the surface electric current calculated by a designated numerical formula.

Because of this arrangement, it is possible to easily form a metal thin film layer by gluing the metal tape to the inside part of the plastic housing. Hence it is possible to obtain a high shield effect while manufacturing is done easily. It is possible to cope with both an effect of radiant heat and high shield-ability against the electromagnetic wave noise under a simple structure. Furthermore, it is possible to properly arrange a position where the metal tape is put under a simple calculation, in a case where the housing has a rectangular parallelepiped configuration.

Twenty Second Embodiment

In the 22nd embodiment, a metal pipe for communicating between the inside and the outside of the housing of the seventeenth through 21st embodiments is provided at the housing so as to come in contact with the thin film layer. In this case, the pipe has a width less than or equal to half of the wavelength of the frequency to be reduced. Because of this structure, the housing having the metal thin film has a substantially same effect as the housing of the eleventh embodiment.

The present invention is not limited to these embodiments, but variations and modifications may be made without departing from the scope of the present invention.

For example, although the plastic housing having the inside part where the metal thin film is applied is discussed in the seventeenth through 21st embodiments, the present invention is not limited to these embodiments. A material such as ceramic, glass, wood may be used for the housing so that the housing has an inside part where the metal thin film is applied.

This patent application is based on Japanese Priority Patent Applications No. 2003-31395 filed on Feb. 7, 2003 and No. 2003-198549 filed on Jul. 17, 2003, the entire contents of which are hereby incorporated by reference.

What is claimed is:

1. A housing structure for reducing an electromagnetic disturbance wave, the housing structure comprising:

an electronic apparatus generating heat and a magnetic field;

a housing having a surface and an inside where the electronic apparatus is provided, the housing made of a metal material, wherein an induced current is generated on the surface of the housing by the magnetic field and has a concentration part that is a center position of the magnetic field, wherein the housing includes a plurality of space forming parts, the space forming parts being formed radially from the concentration part and being placed in a position that limits any disturbance of the induced current, and a longitudinal direction of each of the space forming parts is along the direction of the induced current.

2. The housing structure as claimed in claim 1, wherein the concentration part is generated on a portion of the surface of the housing structure at a center of the space forming parts such that no space forming part extends into the concentration part.

3. The housing structure as claimed in claim 1, wherein the concentration part of the induced current is determined based on the size of the housing and the number of magnetic field patterns.

4. The housing structure as claimed in claim 1, wherein the concentration part of the induced current is determined based on the size of the housing and the number of magnetic field patterns at a specific frequency.

5. The housing structure as claimed in claim 1, wherein the concentration part of the induced current is determined based on the formula $$Cm1, n1 = \left(\frac{a}{2m} + \frac{a}{m}(m1 - 1), -\left(\frac{b}{2n} + \frac{b}{b}(n1 - 1)\right)\right),$$

wherein Cm1 represents the center of the magnetic field distribution, n1 and m1 are optional integers, n represents the number of magnetic field patterns in the y direction, m represents the number of magnetic field patterns in the x direction and b represents the length in the y direction of the housing structure.

6. The housing structure as claimed in claim 1, wherein each of the space forming parts is formed so as to have a slit shape or a rectangular shape.

7. The housing structure as claimed in claim 1, wherein the housing has a rectangular parallelepiped configuration.

* * * * *